United States Patent
Hirayama et al.

(10) Patent No.: US 8,568,556 B2
(45) Date of Patent: Oct. 29, 2013

(54) PLASMA PROCESSING APPARATUS AND METHOD FOR USING PLASMA PROCESSING APPARATUS

(75) Inventors: Masaki Hirayama, Sendai (JP); Tadahiro Ohmi, Sendai (JP)

(73) Assignees: Tokyo Electron Limited (JP); Tohoku University (JP)

( * ) Notice: Subject to any disclaimer, the term of this patent is extended or adjusted under 35 U.S.C. 154(b) by 567 days.

(21) Appl. No.: 12/663,662

(22) PCT Filed: Jun. 11, 2008

(86) PCT No.: PCT/JP2008/060673
§ 371 (c)(1),
(2), (4) Date: Dec. 8, 2009

(87) PCT Pub. No.: WO2008/153054
PCT Pub. Date: Dec. 18, 2008

(65) Prior Publication Data
US 2010/0170872 A1    Jul. 8, 2010

(30) Foreign Application Priority Data
Jun. 11, 2007   (JP) ................... 2007-153553

(51) Int. Cl.
C23C 16/00   (2006.01)
C23F 1/00    (2006.01)
H01L 21/306  (2006.01)

(52) U.S. Cl.
USPC ........... 156/345.41; 118/723 MW; 118/723 R

(58) Field of Classification Search
USPC ............................. 118/723 MW; 156/345.41
See application file for complete search history.

(56) References Cited

U.S. PATENT DOCUMENTS

2002/0076367 A1*  6/2002  Hongoh et al. ............... 422/186
2003/0168012 A1*  9/2003  Tamura et al. ......... 118/723 AN
2004/0149741 A1   8/2004  Ishii et al.
2005/0011455 A1*  1/2005  Yamamoto et al. ... 118/723 MW
2005/0139322 A1*  6/2005  Ishibashi et al. ......... 156/345.48
2006/0238132 A1* 10/2006  Kitamura et al. ........ 315/111.21
2007/0264441 A1* 11/2007  Ishibashi et al. ............. 427/488
2010/0183827 A1   7/2010  Hirayama et al.

FOREIGN PATENT DOCUMENTS

| JP | 10-158847   | 6/1998  |
| JP | 2000-273646 | 10/2000 |
| JP | 2002-053968 | 2/2002  |
| JP | 2003-045848 | 2/2003  |
| JP | 2004-200307 | 7/2004  |

(Continued)

OTHER PUBLICATIONS

International Search Report—PCT/JP2008/060673 dated Sep. 16, 2008.
Japanese Office Action-Japanese Application No. 2009-519274 issued on Jul. 12, 2011, citing JP 10-158847, JP 2005-019508, JP 2002-053968, JP 2003-045848, JP 2005-044822, JP 2007-048982, and WO2008/153064.

(Continued)

Primary Examiner — Rakesh Dhingra
(74) Attorney, Agent, or Firm — Cantor Colburn LLP

(57) ABSTRACT

The plasma processing apparatus includes: a processing container including a metal; an electromagnetic wave source outputting an electromagnetic wave; a dielectric plate facing an inner wall of the processing container and transmitting the electromagnetic wave, which is output from the electromagnetic wave source, into the processing container; and a groove formed in an inner surface of the processing container and functioning as a propagation disturbing portion. If a low frequency microwave is supplied, the propagation of a conductor surface wave can be suppressed by the groove.

16 Claims, 23 Drawing Sheets

(56) References Cited

FOREIGN PATENT DOCUMENTS

| | | |
|---|---|---|
| JP | 2005-019508 | 1/2005 |
| JP | 2005-044822 | 2/2005 |
| JP | 2005-135801 | 5/2005 |
| JP | 2007-048982 | 2/2007 |
| WO | WO 2005078782 * | 8/2005 |
| WO | 2008/153064 | 12/2008 |

OTHER PUBLICATIONS

Notice of Grounds of Rejection issued on Sep. 7, 2010 by Japan Patent Office re: Japanese Patent Application No. 2009-519274, citing JP2005-019508 and JP2004-200307.

\* cited by examiner

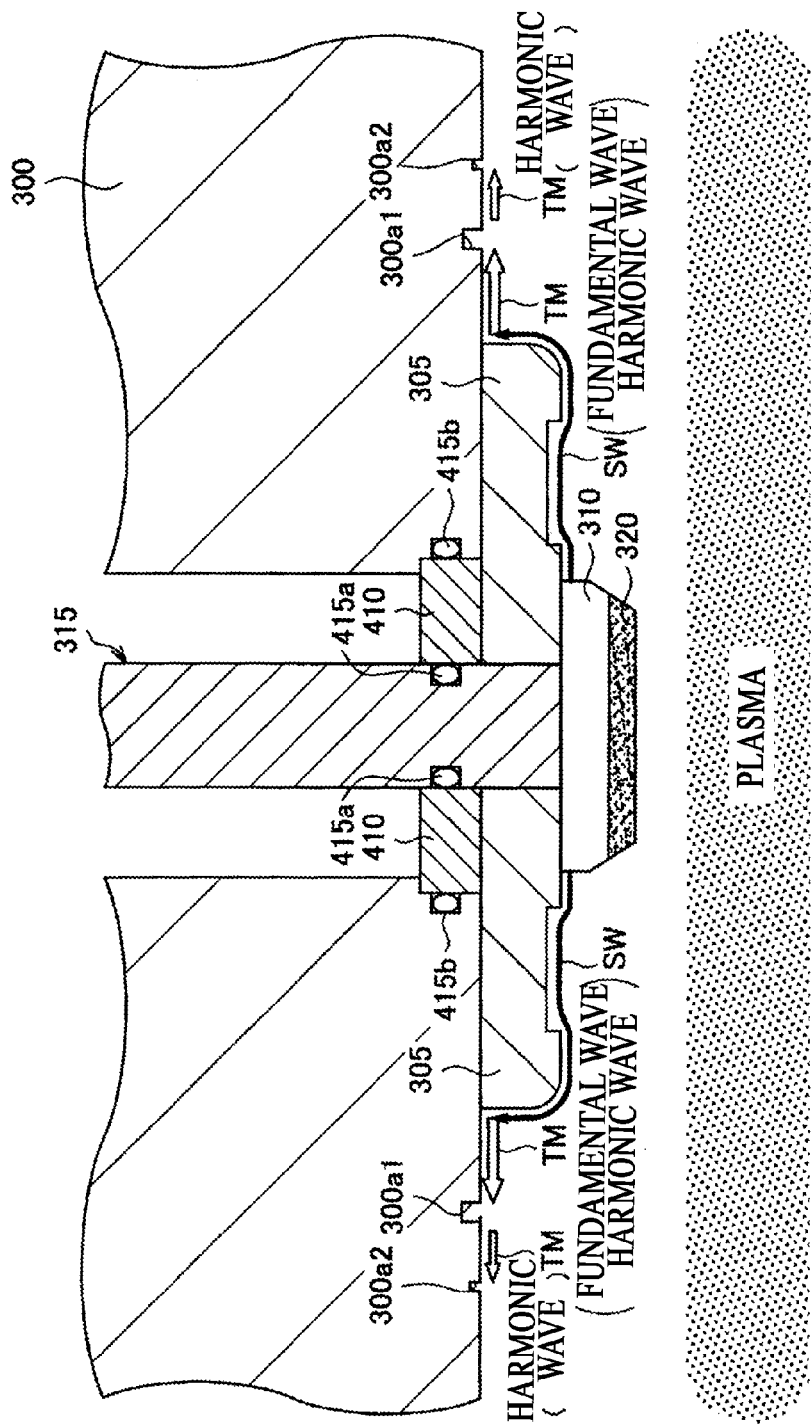

PLASMA PROCESSING APPARATUS AND METHOD FOR USING PLASMA PROCESSING APPARATUS

TECHNICAL FIELD

The present invention relates to a plasma processing apparatus for plasma-processing a target object (i.e., object to be processed) by exciting a gas using an electromagnetic wave, and more particularly, to a plasma processing apparatus including a mechanism for controlling the propagation of an electromagnetic wave.

BACKGROUND ART

Among plasma generated using an electromagnetic wave, microwave plasma is generated by introducing a microwave into a processing chamber, which is depressurized, through a dielectric plate. In a microwave plasma processing apparatus, if the electron density $n_e$ of plasma is higher than cut-off density $n_c$, a microwave cannot be introduced into the plasma and thus propagate between a dielectric plate and the plasma. Part of the microwave propagating between the dielectric plate and the plasma is absorbed as an evanescent wave into the plasma to sustain the plasma. The microwave propagating between the dielectric plate and the plasma is called a surface wave.

Propagation modes of the excited surface wave are determined by the frequency of the microwave, the electron density of the plasma, the shape or size of the dielectric plate, the permittivity of the dielectric plate, and the like. In general, a microwave having a frequency of 2.45 GHz is used as excitation means to generate the plasma, and the surface wave generated beneath the dielectric plate from the microwave is a superposition of multiple propagation modes. In particular, a plurality of propagation modes concentrate on an area having an electron density of about $1 \times 10^{11}$ cm$^{-3}$ to $1 \times 10^{12}$ cm$^{-3}$ which is very suitable for processing the target object.

Meanwhile, the propagation modes of the surface wave are discrete with respect to the electron density of the plasma. Accordingly, there is a possibility that the plasma generated using the surface wave that is the superposition of the multiple propagation modes is non-uniform, thereby making it difficult to process the target object.

In order to overcome this problem, a technology of controlling the propagation modes by arranging a conductive plate provided with a plurality of linear projections close to a surface of the dielectric plate facing a substrate is disclosed in Patent Document 1. In the Patent Document 1, when a microwave is introduced into a processing chamber, the microwave selectively passes through slots while avoiding the linear projections of the conductive plate. Mode selection is carried out while the microwave passes through the slots, thereby improving plasma uniformity.

[Patent Document 1] Japanese Laid-Open Patent Publication No. 2000-273646

DETAILED DESCRIPTION OF THE INVENTION

Disclosure of the Invention

Technical Problem

When a low frequency electromagnetic wave is supplied to a plasma processing apparatus, not only a surface wave propagating between a dielectric plate and plasma but also a surface wave (which is referred as conductor surface wave) propagating between a metal inner surface of a processing container and the plasma are generated. If the electron density of the plasma is less than 2 times the cut-off density $n_c$, the conductor surface wave cannot propagate. Since the cut-off density $n_c$ is proportional to the square of the frequency of the electromagnetic wave, the conductor surface wave cannot propagate if the frequency is low and the electron density is not high. Also, if the frequency is low, it is difficult to attenuate the conductor surface wave.

At a frequency of 2450 MHz often used to generate plasma, the cut-off density $n_c$ is $7.5 \times 10^{10}$ cm$^{-3}$, and if the electron density is not higher than $1.5 \times 10^{11}$ cm$^{-3}$, the conductor surface wave does not propagate. For example, when low density plasma having an electron density of $1 \times 10^{11}$ cm$^{-3}$ near a surface of the plasma is used, the conductor surface wave does not propagate at all. Even if the electron density is higher, since attenuation is large, the propagation of the conductor surface wave is unlikely to be a problem.

Meanwhile, at a frequency of, for example, 915 MHz, even though low density plasma having an electron density of about $1 \times 10^{11}$ cm$^{-3}$ near a surface of the plasma is used, the conductor surface wave propagates for a long time along an inner surface of the processing chamber.

Accordingly, when plasma processing is performed using a low frequency electromagnetic wave, there is a demand for means for controlling the propagation of a conductor surface wave as well as conventional means for controlling the propagation of a surface wave.

Technical Solution

To overcome the above-described problems, according to an aspect of the present invention, there is provided a plasma processing apparatus for plasma-processing a target object (i.e., object to be processed) by exciting a gas using an electromagnetic wave, the plasma processing apparatus including: a processing container including a metal; an electromagnetic wave source for outputting an electromagnetic wave; a dielectric plate facing an inner wall of the processing container and transmitting the electromagnetic wave, which is output from the electromagnetic wave source, into the processing container; and a propagation disturbing portion formed on an inner surface of the processing container.

As shown in FIG. 8, when a conductor surface wave TM reaches a groove 300a, the conductor surface wave TM is divided into a conductor surface wave $TM_{11}$ propagating along a bottom surface of the groove 300a and a transmitted wave $TM_{12}$ jumping the groove 300a and directly delivered to plasma. The conductor surface wave $TM_{11}$ and the transmitted wave $TM_{12}$ meet together at an end portion P of the groove 300a. Part of the conductor surface wave is reflected to become a reflected wave, i.e., a conductor surface wave $TM_{22}$, and the remaining part of the conductor surface wave becomes a travelling wave, i.e., a conductor surface wave $TM_{21}$, and propagates again.

If the phases of the conductor surface wave $TM_{11}$ and the transmitted wave $TM_{12}$ are different from each other by 180 degrees, the conductor surface wave $TM_{11}$ and the transmitted wave $TM_{12}$ cancel each other and are almost totally reflected at the end portion P. In this case, the travelling wave, i.e., the conductor surface wave $TM_{21}$, does not exist. That is, the conductor surface wave TM does not propagate forward beyond the groove 300a.

The propagation disturbing portion includes a mechanism for suppressing the propagation of an electromagnetic wave along the inner surface of the processing container. Accordingly, the conductor surface wave can be prevented from propagating to the target object along the inner surface of the processing container, thereby preventing processing uniformity from decreasing. Also, the conductor surface wave can be prevented from interferingly propagating between a plurality of dielectric plates, thereby preventing plasma uniformity or stability from decreasing. Also, electromagnetic wave energy waste, which is incurred when the plasma is generated in an area where the target object cannot be processed, can be prevented. Also, the conductor surface wave can be prevented from propagating to an area where equipment may be damaged by the energy of the conductor surface wave.

Also, the inner surface of the processing container may include a metal surface of an inner wall of the processing container contacting the plasma, a metal surface of an inner wall, which partitions a plasma processing space, of the processing container, and a metal surface of an inner wall of the processing container which is higher than a position where the target object is placed.

The propagation disturbing portion may include a groove portion reflecting at least part of an electromagnetic wave propagating along the inner surface of the processing container. The groove portion may surround the dielectric plate on the inner surface of the processing container. Also, the groove portion may include a groove having a substantially rectangular cross-section, and the groove may have a width W and a depth D satisfying $0.26<D/W<2.3$. Referring to FIGS. 9 and 10 showing simulation results on how much a conductor surface wave is attenuated by a groove, an aspect ratio D/W when 90% of a conductor surface wave is attenuated, that is, when 90% of the conductor surface wave is reflected by the groove and only 10% of the conductor surface wave jumps the groove and propagates forward has a lower limit of 0.26 and an upper limit of 2.3. It can be seen from the simulation results that the propagation of the conductor surface wave can be suppressed by the groove when the groove is optimized to have a shape satisfying $0.26<D/W<2.3$.

The width of the groove may be less than 2 times a penetration length of the electromagnetic wave into the plasma, and may be greater than 2 times the thickness of a sheath formed between the plasma and the inner surface of the processing container. If the width W of the groove is less than or equal to 2 times the thickness $d_s$ of the sheath ($2d_s \geq W$), as shown in FIG. 11A, the inner space of the groove becomes a sheath region. As a result, the thickness $d_s$ of the sheath does not have a step difference even when the groove is formed, and the conductor surface wave TM is not affected by the groove. Accordingly, in order to suppress the propagation of the conductor surface wave using the groove, the width W of the groove may be greater than 2 times the thickness $d_s$ of the sheath as shown in FIG. 11B.

The penetration length $\delta$ of the electromagnetic wave indicates how deep the electromagnetic wave incident on the plasma can be introduced into the plasma. Accordingly, as shown in FIG. 12A, if the width W of the groove is equal to or greater than 2 times the penetration length $\delta$ ($2\delta \leq W$), since the conductor surface wave $TM_{12}$ cannot penetrate into the plasma more than the penetration length $\delta$, the conductor surface wave $TM_{12}$ cannot jump the groove and propagate. As a result, since the conductor surface wave is not reflected at the end portion P even after the groove is formed, the conductor surface wave $TM_{11}$ propagates forward beyond the groove as the conductor surface wave $TM_{21}$ without being suppressed. Accordingly, in order to suppress the propagation of the conductor surface wave using the groove, the width W of the groove may be less than 2 times the penetration length $\delta$ of the electromagnetic wave as shown in FIG. 12B.

A corner of the groove may have a radius of curvature that is less than 1/40 the wavelength $\lambda$ of the electromagnetic wave propagating between the plasma and the inner surface of the processing container.

Simulation results on the amount of a conductor surface wave transmitted through a corner having a radius of curvature R using simulation are shown in FIG. 13. Electron density $n_e$ was set to $1\times10^{12}\,cm^{-3}$, and plasma potential was set to 24 V. The thickness t of a sheath is 0.07 mm, the wavelength $\lambda$ of the conductor surface wave is 30.4 mm, and a penetration length $\delta$ is 5.3 mm.

The amount of the conductor surface wave transmitted through the corner is the lowest when the radius of curvature R is 0 mm, that is, when the corner is right-angled, and the amount of the conductor surface wave transmitted through the corner increases as the radius of curvature R increases. Assuming that the groove 300a has a function of suppressing the propagation until the amount of transmission is increased by 10% compared to when the radius of curvature R is 0, the radius of curvature R of the corner needs to be increased to 0.77 mm. 0.77 mm is about 1/40 (=0.77/30.4) the wavelength $\lambda$ (30.4 mm) of the conductor surface wave TM. From the simulation results and investigation, the inventors concluded that the radius of curvature R of the corner of the groove 300a needs to be less than 1/40 the wavelength $\lambda$ of the conductor surface wave TM.

The propagation disturbing portion may include a convex portion reflecting at least part of the electromagnetic wave propagating along the inner surface of the processing container. The convex portion may surround the dielectric plate on the inner surface of the processing container. As shown in FIG. 14, when the conductor surface wave TM propagates along a surface of a convex portion 300b, four angular points $C_1$ through $C_4$ may be considered as discontinuous points of impedance, three planes between the angular points $C_1$ through $C_4$ may be considered as transmission lines having certain characteristic impedance, and the convex portion 300b may be considered as a transmission line filter formed by connecting the four discontinuous points of impedance along the three transmission lines. Although the angular points $C_1$ through $C_4$ cannot sufficiently reflect the conductor surface wave TM, a small amount of transmission can be achieved by optimizing the lengths of the planes, that is, the lengths of the transmission lines, of the convex portion 300b.

If the height of the convex portion is too high, since electrons and ions of the plasma may be recombined at a wall surface of the convex portion to reduce plasma density, the height of the convex portion may be as low as possible. However, the height of the convex portion needs to be greater than the thickness of the sheath. This is because if the conductor surface wave TM does not recognize the convex portion as a step difference, the convex portion cannot suppress the propagation. Also, since the phase of the reflection coefficient of each transmission line is rotated 360° at ½ the wavelength of the electromagnetic wave, when the height of the convex portion 300b is less than ½ the wavelength of the conductor surface wave TM, all impedance can be realized.

Accordingly, if the convex portion has a substantially rectangular cross-section, it is preferable that the height of the convex portion is less than ½ the wavelength of the electromagnetic wave propagating along the inner surface of the processing container, and greater than the thickness of the sheath formed between the plasma and the inner surface of the processing container.

The groove may have a substantially rectangular, semicircular, or tapered cross-section. The convex portion may have a substantially rectangular, C-shaped, or T-shaped cross-section.

A plurality of dielectric plates may be used. The propagation disturbing portion may be formed on the inner surface of the processing container to surround each of the plurality of dielectric plates. Accordingly, a surface wave generated under each of the plurality of dielectric plates can be prevented from propagating to the inner surface of the processing container and further propagating as a conductor surface wave close to an adjacent dielectric plate, thereby improving plasma uniformity.

The propagation disturbing portion may be formed on the inner surface of the processing container so as to surround all of the plurality of dielectric plates. In this regard, the propagation disturbing portion may be formed on the inner surface of the processing container so as to surround an opening of the processing container. The propagation disturbing portion may be formed on the inner surface of the processing container so as to surround equipment formed on the inner wall of the processing container.

Accordingly, due to the groove or the convex portion formed in an appropriate position, the equipment, such as a gate valve or a view port, formed on the inner wall of the processing container can be prevented from being destroyed or damaged by the power of the conductor surface wave. Also, the conductor surface wave can be prevented from interferingly propagating between the plurality of dielectric plates, thereby preventing plasma uniformity from decreasing. Also, electromagnetic wave energy waste, which is incurred when the plasma is generated in an area where the target object cannot be processed, can be prevented.

The plurality of dielectric plates each having a substantially square shape may be arranged at regular intervals. A plurality of propagation disturbing portions may be formed at regular intervals on the inner surface of the processing container disposed between the plurality of dielectric plates. The dielectric plates may be arranged continuously or discontinuously to form a cylindrical shape or a polygonal shape, and the plurality of propagation disturbing portions may be formed on the inner surface of the processing container so as to surround the center of inside of the cylindrical shape or the polygonal shape. Accordingly, the plasma can be uniformly generated using the electromagnetic wave introduced from the plurality of dielectric plates each of which has a symmetrical shape, and the propagation of the conductor surface wave can be suppressed by the plurality of propagation disturbing portions disposed between the plurality of dielectric plates, thereby making it possible to generate more uniform plasma.

Each of the plurality of propagation disturbing portions may be formed at the same distance from outer circumferential surfaces of adjacent dielectric plates. Accordingly, the conductor surface wave can be prevented from interferingly propagating between the adjacent dielectric plates, thereby preventing plasma uniformity or stability from decreasing.

The electromagnetic wave source output by the electromagnetic wave source may have a frequency of equal to or less than 1.9 GHz. As shown in FIG. 7, at a frequency of equal to or less than 1.9 GHz, a conductor surface wave may propagate close to the target object along the inner surface of the processing container to generate unexpected plasma around the target object and badly affect plasma processing. The propagation disturbing portion is particularly helpful to suppress the propagation of the conductor surface wave in this case.

The groove portions or the convex portions may be formed substantially in parallel. The smaller the cross-sections of the groove portions or the convex portions, the farther away the plurality of groove portions or the plurality of convex portions may be formed from metal electrodes As shown in FIG. 10, the optimal size or aspect ratio of a groove varies according to electron density. Accordingly, by arranging a plurality of grooves having different sizes or aspect ratios in parallel, a wider electron density range can be used. Also, by arranging a plurality of grooves having the same size in parallel, the propagation of a conductor surface wave can be more firmly suppressed.

As shown in FIG. 18, a conductor surface wave TM includes a fundamental wave component and also a harmonic wave component. Accordingly, a groove portion or a convex portion for a harmonic wave may be formed at a position different from the position where a groove portion or a convex portion for a fundamental wave is formed.

To overcome these problems, according to another aspect of the present invention, there is provided a method of using a plasma processing apparatus for plasma-processing a target object (i.e., object to be processed), the method including: outputting an electromagnetic wave having a frequency of equal to or less than 1.9 GHz from an electromagnetic wave source; transmitting the electromagnetic wave, which is output from the electromagnetic wave source, through a conductive rod; transmitting the electromagnetic wave, which is transmitted through the conductive rod, through a dielectric plate facing an inner wall of a processing container into the processing container; and controlling the propagation of a conductor surface wave using a propagation disturbing portion formed on an inner surface of the processing container to excite a processing gas introduced into the processing container using the electromagnetic wave.

To overcome these problems, according to another aspect of the present invention, there is provided a method of cleaning a plasma processing apparatus, the method including: outputting an electromagnetic wave having a frequency of equal to or less than 1.9 GHz from an electromagnetic wave source; transmitting the electromagnetic wave, which is output from the electromagnetic wave source, through a conductive rod; transmitting the electromagnetic wave, which is transmitted through the conductive rod, through a dielectric plate facing an inner wall of a processing container into the processing container; and controlling the propagation of a conductor surface wave using a propagation disturbing portion formed on an inner surface of the processing container to excite a cleaning gas introduced into the processing container using the electromagnetic wave.

If a microwave having a frequency of, for example, 915 MHz is used as the electromagnetic wave having the frequency of equal to or less than 1.9 GHz, a lower limit of electron density that allows stable plasma having a low electron temperature can be about 1/7 times, and thus plasma suitable for plasma processing can be generated in a wider range than that achieved when a microwave having a frequency of, for example, 2450 MHz is used, thereby dramatically improving the utility of the plasma processing apparatus. As a result, a plurality of processing processes can be performed continuously by using one plasma processing apparatus under different conditions, thereby making it possible to produce high quality products in a short time at reduced costs.

BRIEF DESCRIPTION OF THE DRAWINGS

FIG. 15G illustrates groove portions for a harmonic wave and a fundamental wave.

BEST MODE FOR CARRYING OUT THE INVENTION

The First Embodiment

Figure 1:
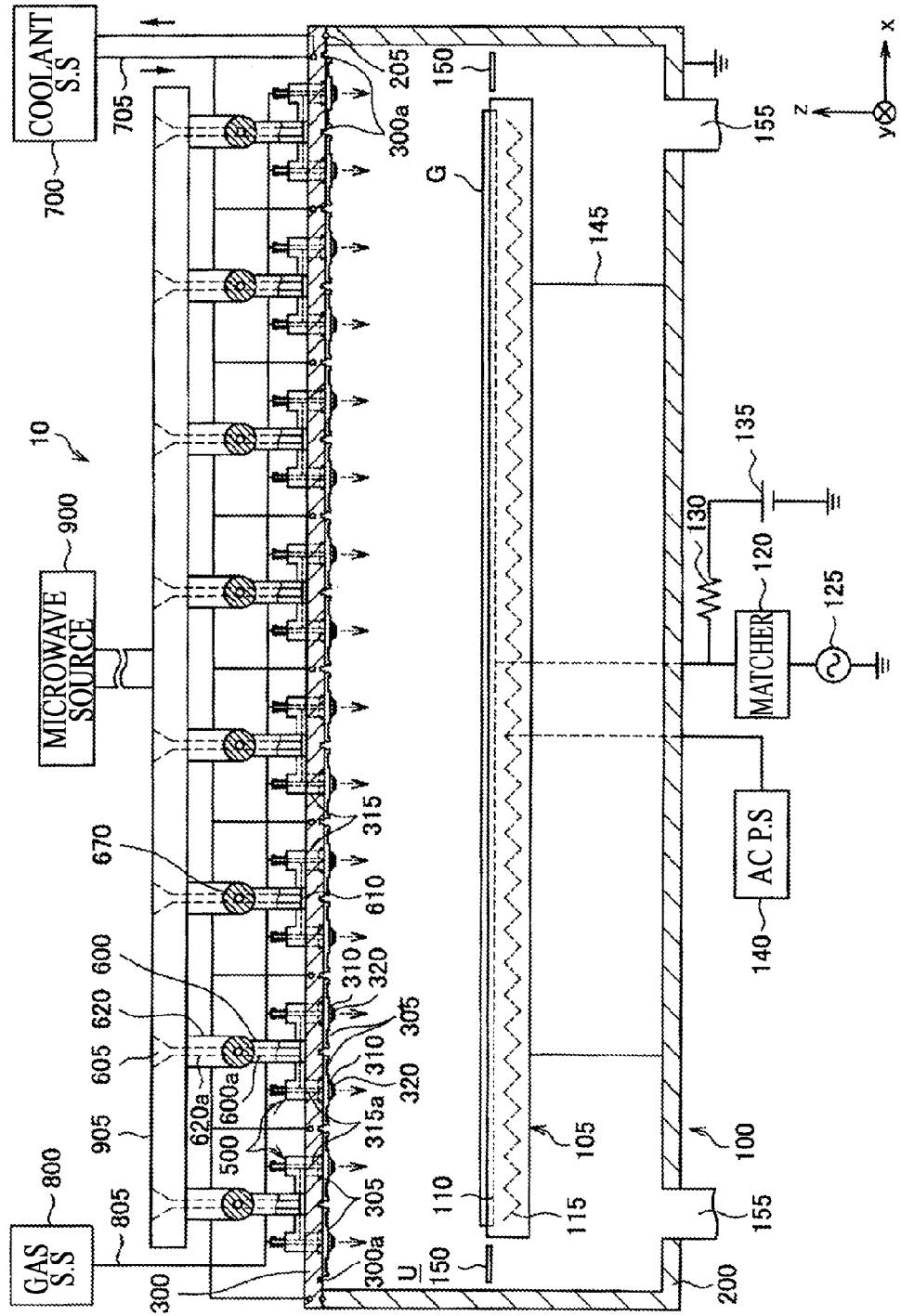
FIG. 1 is a longitudinal cross-sectional view of a plasma processing apparatus according to an embodiment of the present invention.
Figure 2:
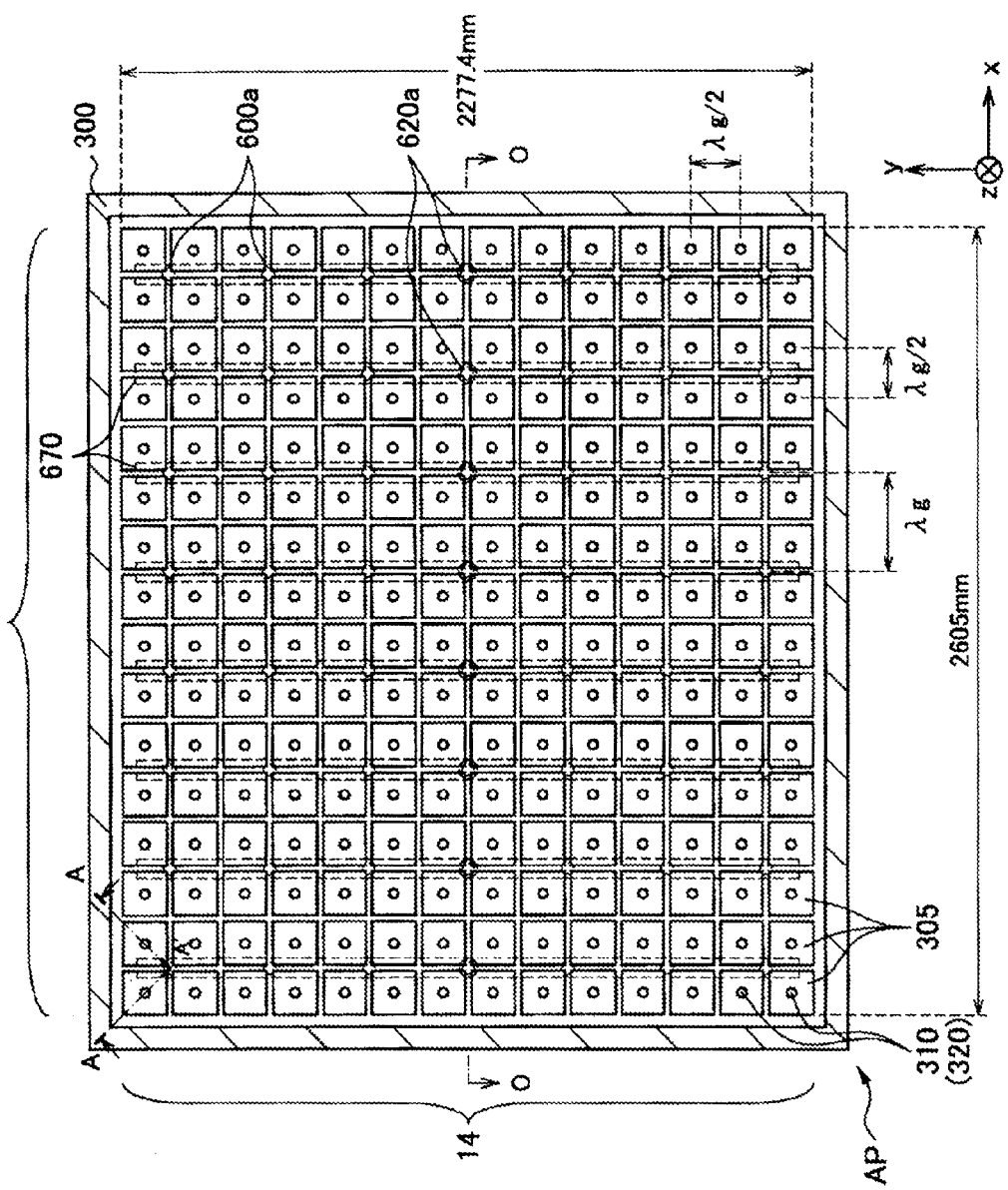
FIG. 2 shows a ceiling surface of the plasma processing apparatus of FIG. 1, according to an embodiment of the present invention.

Referring to the drawings which are appended, the plasma processing apparatus according to the first embodiment is described. The longitudinal cross-sectional view of the plasma processing apparatus 10 of FIG. 1 is taken along a line O-O of FIG. 2, and FIG. 2 shows a ceiling surface of a processing container 100. Elements having the same configuration and the same function are denoted by the same reference numeral, and a repeated explanation thereof will not be given.

(Constitution of the Plasma Processing Apparatus)

Referring to FIGS. 1 and 2, the plasma processing apparatus 10 according to the present embodiment includes the processing container 100 in which a glass substrate (referred to as a substrate G hereinafter) is plasma-processed. The processing container 100 includes a container body 200 and a lid 300. The container body 200 has a cube shape that has a bottom surface and an open top, and the container body 200 is closed at the top by the lid 300. An O-ring 205 is formed between the container body 200 and the lid 300 to seal the container body 200 and the lid 300, thereby forming a processing chamber U. Both the container body 200 and the lid 300 may be formed of a metal, such as aluminum, and are electrically grounded.

A susceptor 105 (stage) on which the substrate G is placed is disposed in the processing container 100. The susceptor 105 may be formed of aluminum nitride, and a power feeder 110 and a heater 115 are formed in the susceptor 105.

A high frequency power source 125 is connected to the power feeder 110 through a matcher 120, e.g., a condenser. Also, a high voltage direct current (DC) power source 135 is connected to the power feeder 110 through a coil 130. The matcher 120, the high frequency power source 125, the coil 130, and the high voltage DC power source 135 are disposed outside the processing container 100. The high frequency power source 125 and the high voltage DC power source 135 are electrically grounded.

The power feeder 110 supplies a predetermined bias voltage into the processing container 100 using high frequency power output from the high frequency power source 125. Also, the power feeder 110 electrostatically chucks the substrate G using a DC voltage output from the high voltage DC power source 135.

An alternating current (AC) power source 140 disposed outside the processing container 100 is connected to the heater 115, so that the substrate G is maintained at a predetermined temperature using an AC voltage output from the AC power source 140. The susceptor 105 is held by a holder 145, and a baffle plate 150 for controlling the flow of a gas in the processing chamber U is disposed near the susceptor 105.

A gas exhaust pipe 155 is disposed at the bottom of the processing container 100, so that a gas in the processing container 100 is exhausted through the gas exhaust pipe 155 using a vacuum pump (not shown) disposed outside the processing container 100, thereby making it possible to depressurize the processing chamber U to a desired degree of vacuum.

A plurality of dielectric plates 305, a plurality of metal electrodes 310, and inner conductors 315a of a plurality of coaxial waveguides 315 are formed on the lid 300. As shown in FIG. 2, the dielectric plates 305, each of which is a plate formed of alumina ($Al_2O_3$) and having a substantially square shape of 148 mm×148 mm, are arranged lengthwise and crosswise at regular intervals of an integer multiple (here, the integer multiple is 1) of $\lambda g/2$. The $\lambda g$ is the guide wavelength of a split coaxial waveguide 670 (The $\lambda g$ is 328 mm at 95 MHz). Accordingly, 224 (=14×16) dielectric plates 305 are uniformly arranged on the ceiling surface of the processing container 100, wherein the ceiling surface has a size of 2277.4 mm×2605 mm.

Accordingly, since each of the dielectric plates 305 has a symmetrically good shape, uniform plasma is easily generated using each of the dielectric plates 305. Also, since the plurality of dielectric plates 305 are arranged at regular intervals of an integer multiple of λg/2, if a microwave is introduced using the inner conductors 315a of the coaxial waveguides 315, uniform plasma can be generated.

Figure 3:
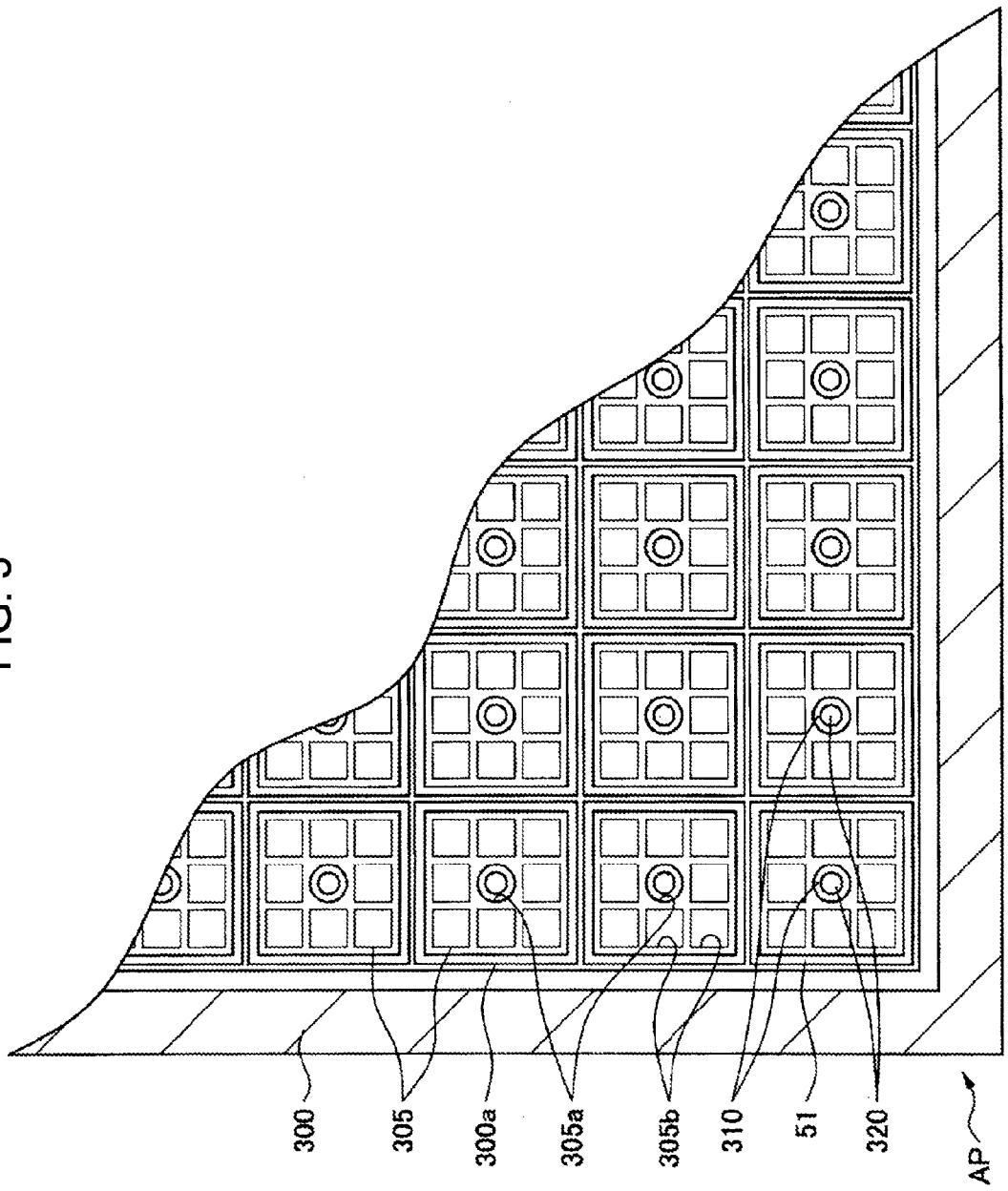
FIG. 3 is an enlarged view of FIG. 2, according to an embodiment of the present invention.

FIG. 3 is an enlarged view of FIG. 2 seen from an AP viewpoint, according to an embodiment of the present invention. Referring to FIG. 3, a groove 300a having a substantially rectangular shape is formed on an inner surface of the processing container 100 close to each of the plurality of dielectric plates 305. The groove 300a is formed at the same distance from outer circumferential surfaces of adjacent dielectric plates 305 to surround each of the dielectric plates 305. Accordingly, the groove 300a can suppress the propagation of a conductor surface wave.

8 concave portions 305b are formed on a bottom surface, which contacts plasma, of each of the dielectric plates 305 to be substantially axially symmetrical about each of the metal electrodes 310. Accordingly, a microwave can be uniformly introduced into the processing container 100.

When a microwave passes through the dielectric plates 305, the electric field of the microwave is concentrated on sidewalls of the concave portions 305b, which are perpendicular to the longitudinal direction of the dielectric plates 305, formed in the dielectric plates 305. The electric field energy of the microwave supplied to a space under the dielectric plates 305 varies according to the thicknesses of the dielectric plates 305. Once the concave portions 305b are formed in the dielectric plates 305, the electric field strength of the dielectric plates 305 are particularly increased and thus high density plasma is stably generated around the concave portions 305b, thereby improving plasma stability and plasma excitation efficiency. Also, the electric field strength of the microwave under the dielectric plates 305 varies according to the thicknesses of the dielectric plates 305.

In detail, as the thicknesses of the dielectric plates 305 decrease, the electric field strength at surfaces tends to increase. Accordingly, more uniform plasma can be generated over the entire surfaces of the dielectric plates 305 by increasing the thicknesses of some of the dielectric plates 305 where plasma density is easily increased and decreasing the thicknesses of some other of the dielectric plates 305 where plasma density is easily decreased.

In particular, in this embodiment, since the metal electrodes 310 are arranged substantially at the centers of surfaces of the dielectric plates 305 facing the substrate G, 8 concave portions or convex portions are disposed to be substantially point-symmetrical about each of the metal electrodes 310. In this embodiment, among 8 concave portions, since some concave portions having corners where plasma density is easily reduced because of a long distance from the center of each of the dielectric plates 305 are set to have a relatively deep depth of 4 mm, and other concave portions are set to have a relatively shallow depth of 2 mm, more uniform plasma can be generated through the optimization of the thicknesses of the concave portions 305b of the dielectric plates 305.

Figure 5:
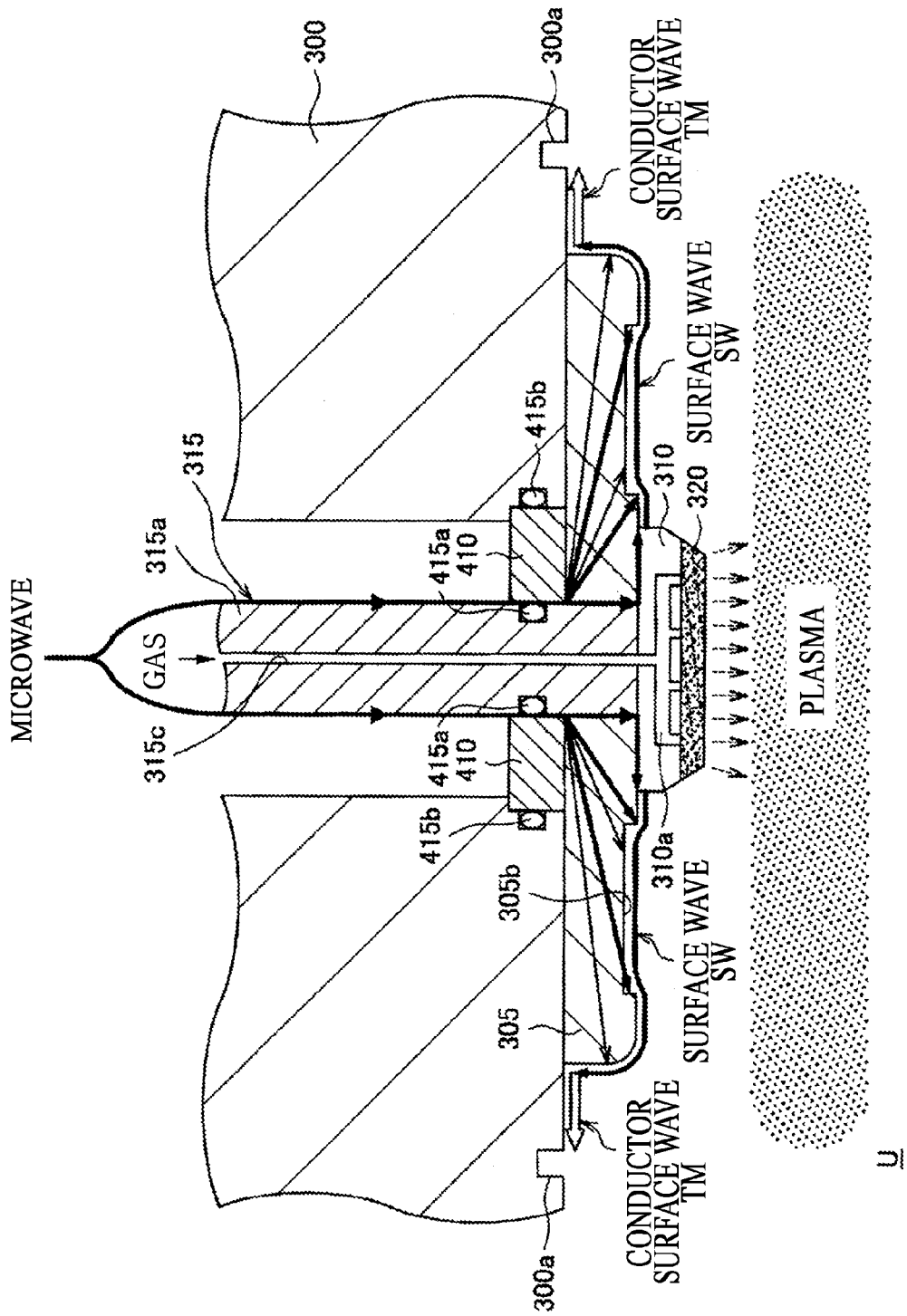
FIG. 5 is an enlarged cross-sectional view illustrating a metal electrode of the plasma processing apparatus of FIG. 1, according to an embodiment of the present invention.

Referring to FIG. 5, a microwave propagates as a surface wave SW between the dielectric plates 305 and plasma. If a low frequency microwave is supplied, the surface wave SW reaches an end portion of each of the dielectric plates 305 and then further propagates as a conductor surface wave TM between the plasma and an inner surface of the processing container 100, for example, a metal surface of an inner wall of the processing container 100.

If the conductor surface wave TM propagates to an adjacent dielectric plate 305 as shown in FIG. 3, the conductor surface wave TM may interfere with the surface wave SW propagating along a surface of the adjacent dielectric plate 305, thereby damaging plasma uniformity or stability.

In order to overcome this problem, the groove 300a is formed at the same distance from the outer circumferential surfaces of adjacent dielectric plates 305 to surround each of the dielectric plates 305, so that a conductor surface wave can be prevented from interferingly propagate between adjacent dielectric plates 305, thereby preventing plasma uniformity or stability from decreasing. Also, the conductor surface wave can be prevented from propagating close to the substrate G along the inner surface of the processing container, thereby preventing processing uniformity from decreasing. Also, microwave energy waste, which is incurred when the plasma is generated in an area where the plasma cannot be used to process the target object, can be prevented. Also, the conductor surface wave can be prevented from propagating to an area where equipment may be damaged due to the energy of the conductor surface wave.

The metal electrodes 310 connected to front ends of the inner conductors 315a through through-holes 305a are formed at the centers of the dielectric plates 305 to be exposed to the substrate G. The dielectric plates 305 are held by the inner conductors 315a and the metal electrodes 310. Dielectric covers 320 are formed on parts of exposed portions of the metal electrodes 310, thereby preventing the concentration of an electric field on the exposed portions of the metal electrodes 310.

Figure 4:
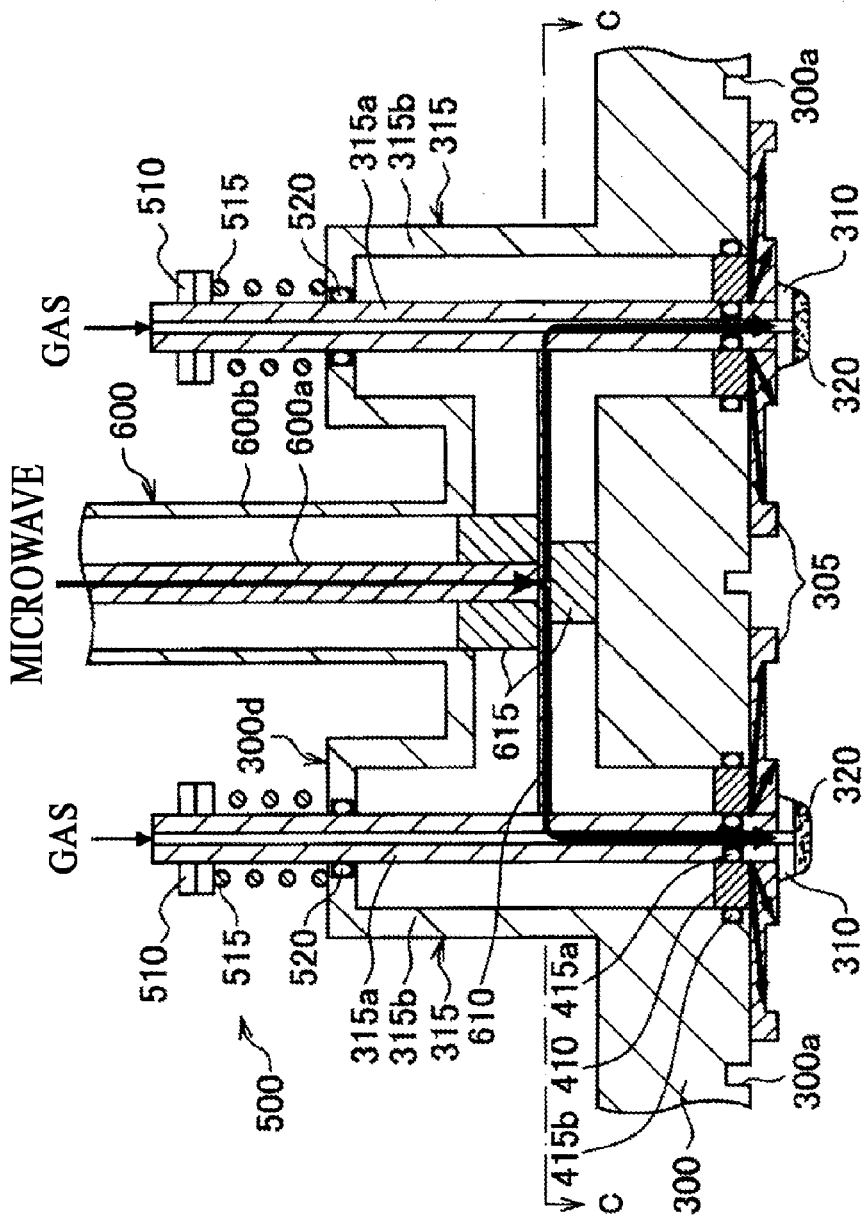
FIG. 4 is an enlarged cross-sectional view illustrating a split plate of the plasma processing apparatus of FIG. 1, according to an embodiment of the present invention.

The plasma processing apparatus 10 will now be explained further with reference to FIG. 4. FIG. 4 is an enlarged cross-sectional view taken along a line A-A'-A of FIG. 2 illustrating a split plate 610 of the plasma processing apparatus 10 of FIG. 1, according to an embodiment of the present invention. The coaxial waveguides 315 include the inner conductors 315a, that is, axial parts, which are cylindrical, and outer conductors 315b, and may be formed of a metal, e.g., copper. A ring-shaped dielectric body 410, and O-rings 415a and 415b which vacuum-seal the processing chamber U at both ends of the ring-shaped dielectric body 410, are installed between the lid 300 and the inner conductors 315a.

Each of the inner conductors 315a passes through a lid portion 300d that is integrally formed with the lid 300, to be exposed to the outside of the processing container 100. Each of the inner conductors 315 is raised away from the processing container 100 due to the elastic force of a spring member 515 with the help of a fixing mechanism 500 that includes a connector 510, the spring member 515, and a shorting portion 520.

The shorting portion 520 is formed at a position where each of the inner conductors 315a passes through the lid portion 300d, and electrically short-circuits the lid portion 300d and the inner conductor 315a of the coaxial waveguide 315. The shorting portion 520 includes a shield spiral to allow the inner conductors 315a to slide vertically. The shorting portion 520 may include a metal brush.

Since the shorting portion 520 provides a vacuum seal between the lid portion 300d and a dielectric body 615, which is described later, and between the inner conductor 315a and the lid portion 300d using O-rings (not shown) and an inert gas is filled in an inner space of the lid portion 300d, impurities in the air can be prevented from being introduced into the processing chamber.

Since a coolant supply source 700 of FIG. 1 is connected to a coolant tube 705, and a coolant supplied by the coolant supply source 700 is circulated in the coolant tube 705 and returns to the coolant supply source 700, the processing container 100 can be maintained at a desired temperature. A gas supply source 800 introduces a gas into the processing chamber U from a gas passage in each of the inner conductors 315a of FIG. 4 through a gas line 805.

A microwave of 120 kW (=60 kW×2(2 W/cm²) output from two microwave sources 900 is transmitted through a split waveguide 905, a converter 605, a coaxial waveguide 620, a coaxial waveguide 600, a split plate 610, and each of the coaxial waveguides 315, passes through the plurality of dielectric plates 305, and is supplied into the processing chamber U. The microwave introduced into the processing chamber U excites a processing gas supplied by the gas supply source 800 to generate plasma, and desired plasma processing is performed on the substrate G using the generated plasma.

(The Suppression of the Propagation of a Conductor Surface)

The propagation of a microwave will now be explained, and then the suppression of the propagation of a conductor surface wave will be explained in detail. A relationship between the propagation of a conductor surface wave TM and frequency is shown below.

(Relationship Between the Propagation of the Conductor Surface Wave and the Frequency)

The permittivity of plasma is expressed as $\epsilon_r' - j\epsilon_r''$. Since there is a lost component in the permittivity of the plasma, the permittivity of the plasma is described by a complex number. The absolute value $\epsilon_r'$ of the permittivity of the plasma is typically less than −1. The permittivity of the plasma can be obtained using Equation 1.

$$\epsilon_r' - j\epsilon_r'' = 1 - \frac{(\omega_{pe}/\omega)^2}{1 - j(v_c/\omega)} \tag{1}$$

Propagation characteristics when a microwave is incident on the plasma can be obtained using Equation 2.

$$k = k_0 \left(1 - \frac{(\omega_{pe}/\omega)^2}{1 - j(v_c/\omega)}\right)^{1/2} \tag{2}$$

where k is a wave number, $K_0$ is a wave number in vacuum, $\omega$ is the frequency of a conductor surface wave, $v_c$ is an electron impact frequency, and $\omega_{pe}$ is an electron plasma frequency obtained using Equation 3.

$$\omega_{pe} = \sqrt{\frac{e^2 n_e}{\epsilon_0 m_e}} \tag{3}$$

where "e" is an elementary electric charge, $n_e$ is the electron density of the plasma, $\epsilon_0$ is a permittivity in vacuum, and $m_e$ is an electron mass.

A penetration length δ indicates how deep a microwave incident on the plasma can be introduced into the plasma. In detail, the penetration length δ is a length taken for the electric field strength E of the microwave to be attenuated to 1/e of the electric field strength $E_0$ at a boundary surface of the plasma. The penetration length δ can be obtained using Equation 4.

$$\delta = -1/Im(k) \tag{4}$$

where k is a wave number as described above.

If the electron density $n_e$ is greater than cut-off density $n_c$ obtained using Equation 5 below, the microwave cannot propagate through the plasma, and thus the microwave incident on the plasma is rapidly attenuated.

$$n_c = \epsilon_0 m_e \omega^2 / e^2 \tag{5}$$

Referring to Equation 4, the penetration length δ, which is several mm to several tens of mm, decreases as the electron density $n_e$ increases. If the electron density $n_e$ is sufficiently greater than the cut-off density $n_c$, the penetration length δ is not greatly affected by a frequency.

The thickness $d_s$ of a sheath of the plasma can be obtained using Equation 6.

$$d_s = 0.606 \lambda_D \left\{\frac{2eV_p}{k_B T_e}\right\}^{4/3} \tag{6}$$

where $V_P$ is the potential of the plasma, $K_B$ is the Boltzmann constant, $T_e$ is an electron temperature, and $\lambda_D$ is a Debye length obtained using Equation 7 below. The Debye length $\lambda_D$ indicates the exponential decrease in the potential of the plasma.

$$\lambda_D = \sqrt{\frac{\epsilon_0 k_B T_e}{n_e e^2}} \tag{7}$$

Referring to Equation 6, the thickness $d_s$ of the sheath is several tens of μm to several hundreds of μm. The thickness $d_s$ of the sheath is proportional to the Debye length $\lambda_D$. In Equation 7, as the electron density $n_e$ increases, the Debye length $\lambda_D$ decreases.

⌈Wavelength and Attenuation of the Conductor Surface Wave TM⌋

Figure 6:
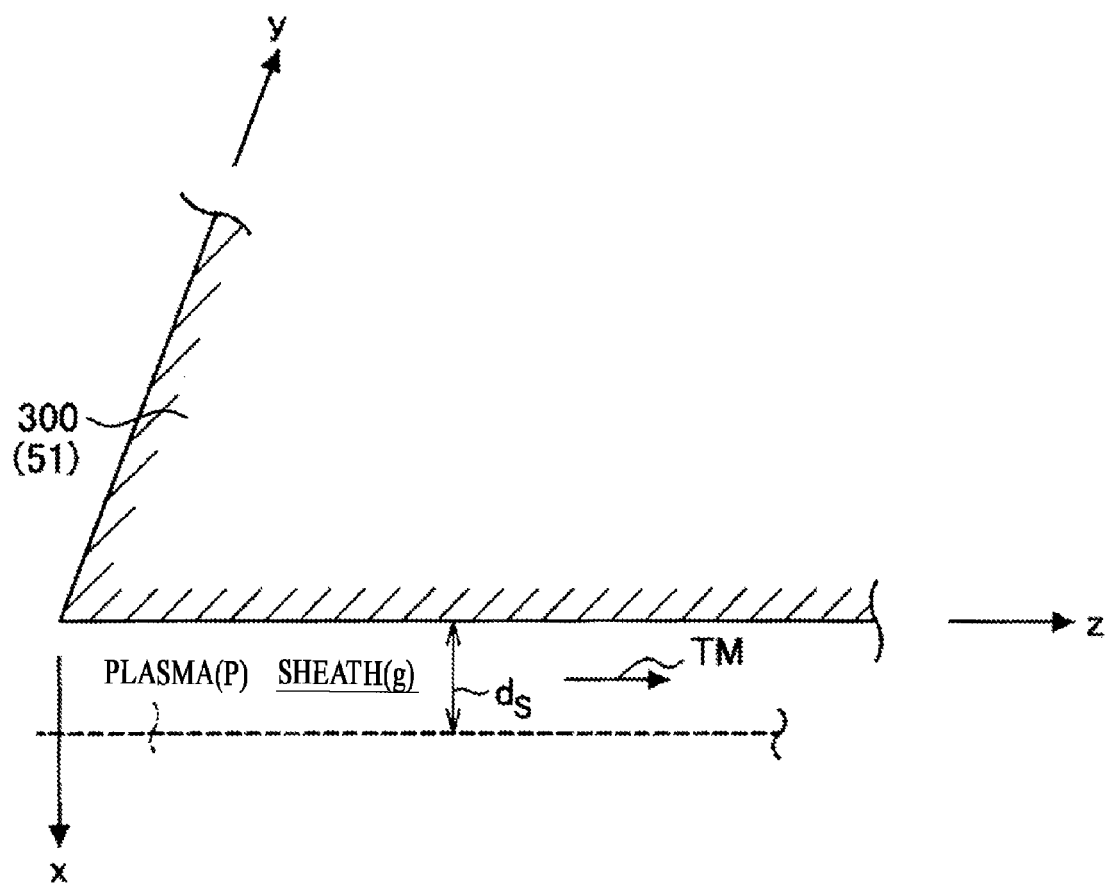
FIG. 6 is a diagram for explaining the propagation of a conductor surface wave.

FIG. 6 is a diagram for explaining the propagation of a conductor surface wave TM. Referring to FIG. 6, it is assumed that the conductor surface wave TM propagates in a z-direction through a sheath g having an infinitely large thickness $d_s$ formed between a plasma P and a bottom surface of the lid 300, which is a conductor, that is, a surface wave propagation portion 51. The permittivity of the sheath g is $\epsilon_r = 1$ and the permittivity of the plasma P is $\epsilon_r' - j\epsilon_r''$. An equation (Equation 8 below) which a magnetic field Hy in a y-direction of FIG. 6 satisfies is derived from Maxwell's equations.

$$\frac{\partial^2 H_y}{\partial x^2} + h H_y = 0 \tag{8}$$

where h is a characteristic value and is obtained as follows.

$$h^2 = \begin{cases} k_0^2 + \gamma^2 \equiv h_t^2 & 0 < x < t \\ (\epsilon_r' - j\epsilon_r'') k_0^2 + \gamma^2 \equiv h_e^2 & x > t \end{cases} \tag{9} \tag{10}$$

where γ is a propagation constant, $h_t$ is a characteristic value in the sheath g, and $h_e$ is a characteristic value in the plasma P. The characteristic values $h_t$ and $h_e$ are complex numbers in general.

From a boundary condition under which an electric field strength in a z-direction is 0 at the bottom surface of the lid 300 that is a conductor, general solutions using Equations 11 and 12 are obtained as follows.

$$H_y = A\cos(h_i x)e^{-\gamma z} \quad 0 < x < t \quad (11)$$

$$H_y = Be^{-jh_e x}e^{-\gamma z} \quad x > t \quad (12)$$

where A and B are random fixed numbers.

If the random fixed numbers A and B are removed at points where tangential components of a magnetic field and an electric field are continuous across a boundary between the sheath g and the plasma P, the following characteristic equation is derived.

$$(\in_r' - j\in_r'')h_i \tan(h_i d_s) = jh_e$$

$$h_i^2 - h_e^2 = (1 - \in_r' - j\in_r'')k_0^2 \quad (13)$$

In Equation 13, the thickness $d_s$ of the sheath is obtained from Equation 6, and the permittivity $\in_r' - j\in_r''$ of the plasma P is obtained from Equation 1. Accordingly, the characteristic values $h_i$ and $h_e$ are obtained by solving Equation 13. If a plurality of solutions exist, a solution that allows a magnetic field distribution in the sheath to be a hyperbolic function may be selected. The propagation constant $\gamma$ is obtained using Equation 9.

The propagation constant $\gamma$ is expressed as $\gamma = \alpha + j\beta$ from an attenuation constant $\alpha$ and a phase constant $\beta$. From the definition of the propagation constant $\gamma$, the electric field strength E of the plasma can be obtained using Equation 14.

$$E = E_0 \times e^{-j\gamma z} = E_0 e^{-\alpha z} e^{j\beta z} \quad (14)$$

where z is the propagation distance of the conductor surface wave TM, and $E_0$ is an electric field strength when the propagation distance z is 0. $e^{-\alpha z}$ indicates the exponential attenuation of the conductor surface wave TM during the propagation, and $e^{j\beta z}$ indicates the rotation of the phase of the conductor surface wave TM. Since $\beta = 2\pi/\lambda$, the wavelength $\lambda$ of the conductor surface wave TM is obtained from the phase constant $\beta$. Accordingly, the amount of attenuation of the conductor surface wave TM and the wavelength $\lambda$ of the conductor surface wave TM can be obtained using the propagation constant $\gamma$. The unit of the attenuation constant $\alpha$ is Np(neper)/m, and the attenuation constant $\alpha$ has the following relationship with the unit dB/m in each graph.

1 Np/m=20/ln(10)dB/m=8.686 dB/m

Based on these equations, the penetration length $\delta$, the thickness $d_s$ of the sheath, and the wavelength $\lambda$ of the conductor surface wave TM when a microwave frequency is 915 MHz, an electron temperature Te is 2 eV, a plasma potential Vp is 24 V, and the electron density $n_e$ is $1\times10^{11}$ cm$^{-3}$, $4\times10^{11}$ cm$^{-3}$, and $1\times10^{12}$ cm$^{-3}$ were calculated. The calculation results are shown in Table 1 below.

TABLE 1

| Electron density $n_e$ | Penetration length $\delta$ | Thickness of sheath $d_s$ | Wavelength $\lambda$ of conductor surface wave |
|---|---|---|---|
| $1\times10^{11}$ cm$^{-3}$ | 17.8 mm | 0.22 mm | 11.7 mm |
| $4\times10^{11}$ cm$^{-3}$ | 8.5 mm | 0.11 mm | 23.6 mm |
| $1\times10^{12}$ cm$^{-3}$ | 5.3 mm | 0.07 mm | 30.4 mm |

The conductor surface wave is cut off at or below a certain electron density, and thus cannot propagate. The certain electron density is called a conductor surface wave resonance density $n_r$ and is twice the cut-off density $n_c$ of Equation 5. Since the cut-off density $n_c$ is proportional to the square of a frequency, the conductor surface wave propagates even at low electron density if the frequency is low.

At a frequency of 2.45 GHz, the conductor surface wave resonance density $n_r$ is $1.5\times10^{11}$ cm$^{-3}$. Under an actual plasma processing condition, electron density around a surface is less than $1\times10^{11}$ cm$^{-3}$ sometimes. However, in this case, the conductor surface wave does not propagate. At a frequency of 915 MHz, the conductor surface wave resonance density $n_r$ is $2.1\times10^{10}$ cm$^{-3}$ which is about ⅐ the conductor surface wave resonance density $n_r$ at the frequency of 2.45 GHz. At the frequency of 915 MHz, the conductor surface wave propagates even when the electron density around the surface is less than $1\times10^{11}$ cm$^{-3}$.

⌈Limitation on the Frequency⌋

Figure 7:
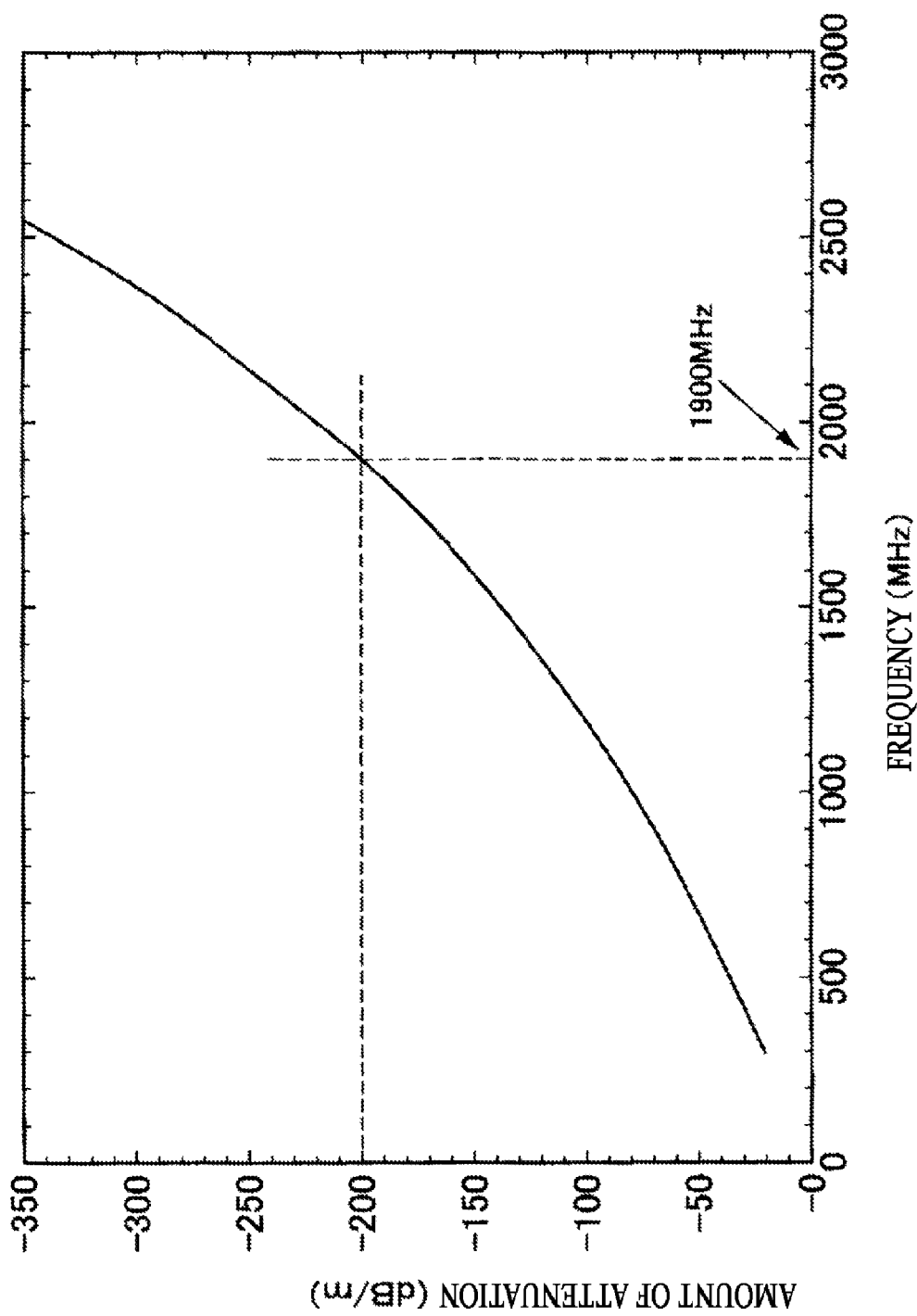
FIG. 7 is a graph illustrating a relationship between a frequency and the amount of attenuation of a conductor surface wave.

FIG. 7 is a graph illustrating a relationship between a frequency and the amount of attenuation of a conductor surface wave TM under the following condition. It can be seen from FIG. 7 that as the frequency decreases, the amount of attenuation decreases. The reason is as follows. According to Equation 10, if the frequency is lowered, the real part $\in_r'$ of the permittivity of the plasma P is negatively increased and plasma impedance is reduced. Accordingly, a microwave electric field in the plasma is weaker than a microwave electric field in the sheath, and thus microwave loss in the plasma is reduced, thereby reducing the amount of attenuation of the conductor surface wave TM. The condition includes that electron density around the inner wall of the processing container is $4\times10^{11}$ cm$^{-3}$, an electron temperature is 2 eV, a sheath voltage is 24 V, a pressure is 13.3 Pa, and a gas is Ar.

In the plasma processing apparatus 10 of FIG. 1, if a conductor surface wave TM released from the dielectric plates 305 propagates along the inner wall of the processing container 100, in detail, along the bottom surface of the lid 300 and the inner surface of the container body 200, close to the substrate G, many problems are caused, for example, plasma P generated in the processing container 100 is non-uniform, process uniformity is deteriorated, or the gate valve opened or closed to carry the substrate G in and out of the processing container 100 or the susceptor 105 on which the substrate G is placed are degraded. If the conductor surface wave TM is not sufficiently attenuated while propagating between the dielectric 305 and the substrate G, that is, if the amount of attenuation of the conductor surface wave TM is less than 20 dB, means for reflecting the conductor surface wave TM and preventing the conductor surface wave TM from propagating is required. In the plasma processing apparatus 10 of FIG. 1, if a standard distance between the dielectric 305 and the substrate G is about 0.1 m and the amount of attenuation when the conductor surface wave TM propagates along the standard distance is 20 dB, the amount of attenuation per 1 m is 200 dB/m. A frequency in this case is 1.9 GHz, as can be seen from FIG. 7. That is, if a frequency is equal to or less than 1.9 GHz, means for reflecting the conductor surface wave TM is required.

⌈Aspect Ratio (D/W) of the Groove 300a⌋

Figure 8:
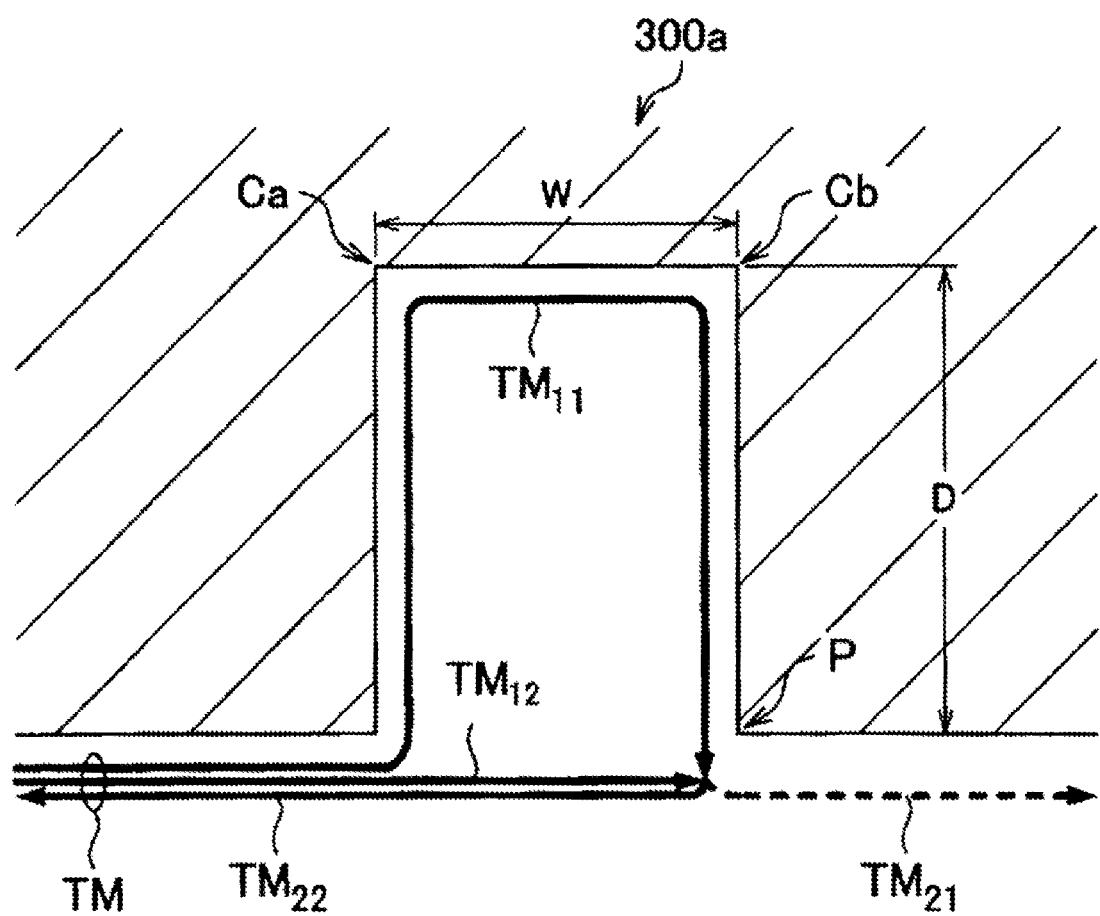
FIG. 8 is a cross-sectional view for explaining a conductor surface wave propagating along a groove.

The inventors tried to optimize the shape of the groove 300a in order to effectively suppress the propagation. When the shape of the groove 300a is optimized, it is important what electron density is used to calculate the optimized shape. The depth of the conductor surface wave penetrated into the plasma corresponds to the penetration length $\delta$, which is several mm to several tens of mm (see Table 1). When measured under various conditions, electron density near a surface of plasma was $1\times10^{11}$ cm$^{-3}$ to $10^{12}$ cm$^{-3}$. Accordingly, the electron density $n_e$ was set to $1\times10^{11}$ cm$^{-3}$ to $10^{12}$ cm$^{-3}$. The groove 300a having a substantially rectangular cross-section as shown in FIG. 8 was selected. A plasma potential was set to 24 V, and an electron temperature was set to 2 eV. The width of the groove 300a is W, and the depth of the groove 300a is D.

In order to obtain the optimal aspect ratio D/W of the groove 300a, how much the conductor surface wave TM is attenuated by the groove 300a when the electron density $n_e$ is $1\times10^{11}$ cm$^{-3}$, $4\times10^{11}$ cm$^{-3}$, and $1\times10^{12}$ cm$^{-3}$ was obtained by simulations. The width W of the groove 300a was set to 4 mm. The simulation results are shown in FIG. 9, and will be examined below with reference to FIG. 10.

As shown in FIG. 8, when the conductor surface wave TM reaches the groove 300a, the conductor surface wave TM is divided into the conductor surface wave $TM_{11}$ propagating along the bottom surface of the groove 300a, and the transmitted wave $TM_{12}$ jumping the groove 300a and directly delivered to the plasma. The conductor surface wave $TM_{11}$ and the transmitted wave $TM_{12}$ meet at the end portion P of the groove 300a. Part of the conductor surface wave is reflected to become the reflected wave, i.e., the conductor surface wave $TM_{22}$, and the remaining part of the conductor surface wave becomes the travelling wave, i.e., the conductor surface wave $TM_{21}$, and propagates again.

If the phases of the conductor surface wave $TM_{11}$ and the transmitted wave $TM_{12}$ are different from each other by 180 degrees, the conductor surface wave $TM_{11}$ and the transmitted wave $TM_{12}$ cancel each other and are almost totally reflected at the end portion P. In this case, the travelling wave, i.e., the conductor surface wave $TM_{21}$, does not exist. That is, the conductor surface wave TM does not propagate forward beyond the groove 300a.

Figure 9:
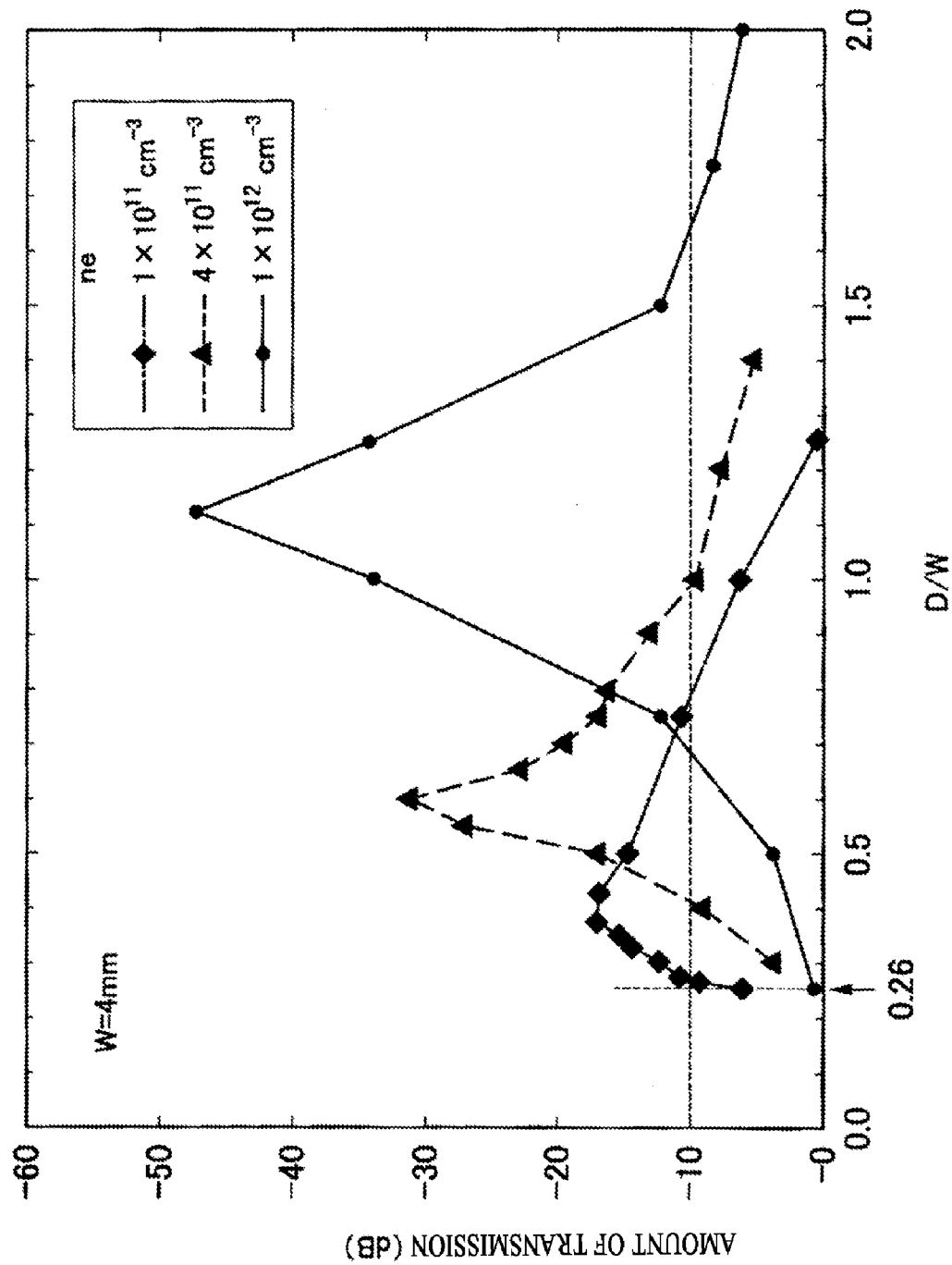
FIG. 9 is a graph illustrating a relationship between the amount of transmission and the aspect ratio of a groove when electron density is changed.

For example, if the amount of transmission of the conductor surface wave TM is −10 dB in FIG. 9, 90% of the conductor surface wave TM is reflected by the groove 300a to become the reflected wave $TM_{22}$, and 10% of the conductor surface wave TM becomes the conductor surface wave $TM_{21}$ and propagates beyond the groove 300a. That is, in this case, 90% of the conductor surface wave TM is disturbed by the groove 300a and thus is attenuated by the groove 300a.

Referring to FIG. 9, as the electron density $n_e$ increases, the aspect ratio D/W having the lowest amount of transmission increases. If the electron density $n_e$ is any one of $1\times10^{11}$ cm$^{-3}$, $4\times10^{11}$ cm$^{-3}$, and $1\times10^{12}$ cm$^{-3}$ and the aspect ratio D/W is equal to or greater than 0.26, equal to or more than 90% of the conductor surface wave TM is reflected by the groove 300a. Once 90% of the conductor surface wave TM is reflected by the groove 300a, it can be said that the groove 300a sufficiently suppresses the propagation of the conductor surface wave TM. Accordingly, the inventers set 0.26, at which 90% of the conductor surface wave TM is reflected in any electron density, as a lower limit of the aspect ratio D/W.

Figure 10:
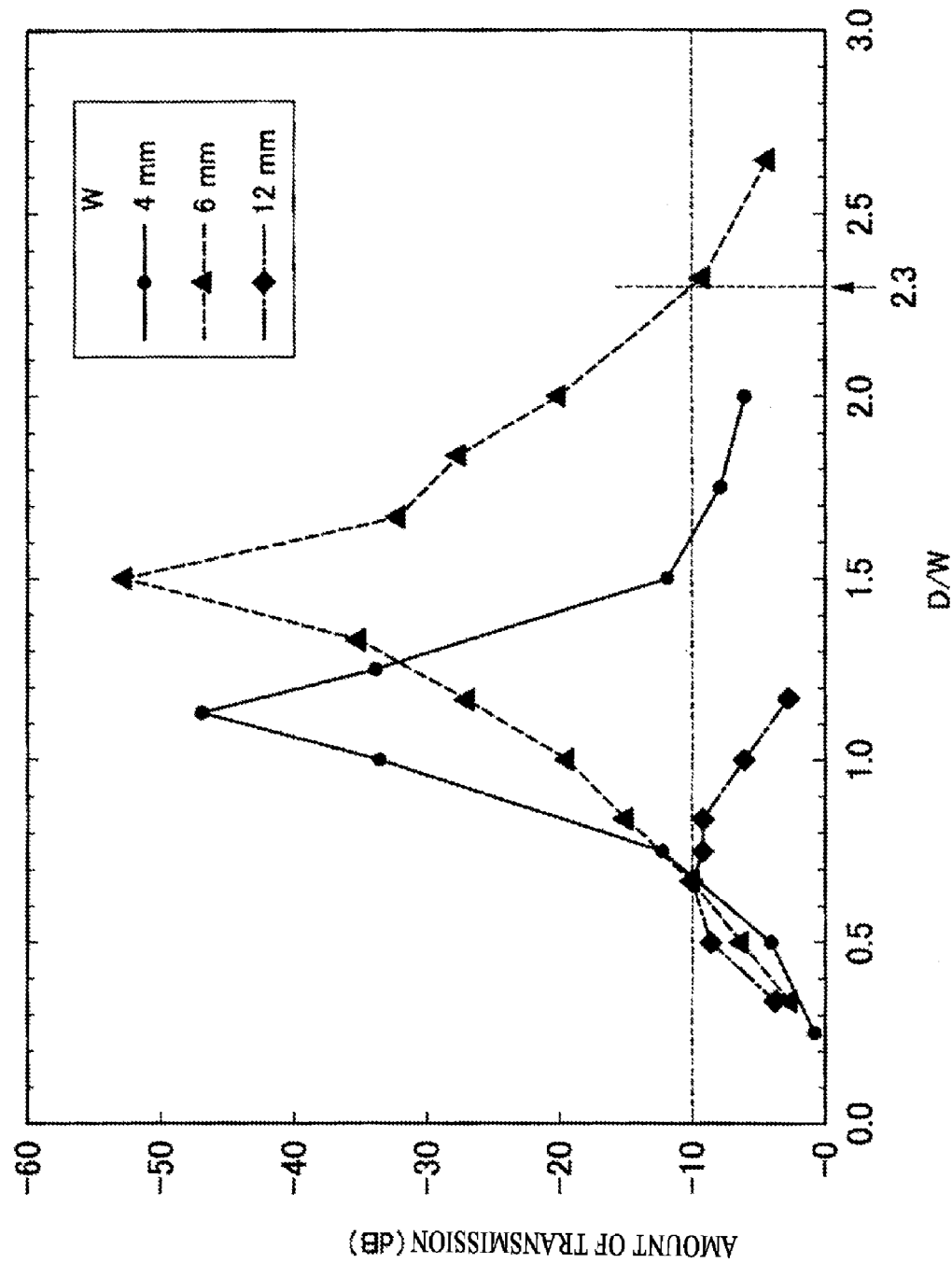
FIG. 10 is a graph illustrating a relationship between the amount of transmission and the aspect ratio of a groove when the width of a groove is changed.

A relationship between the amount of transmission of the conductor surface wave TM and the aspect ratio D/W when the width W of the groove 300a was 4 mm, 6 mm, and 12 mm is shown in FIG. 10. In FIG. 10, the electron density $n_e$ was set to $1\times10^{12}$ cm$^{-3}$. As described above, as the electron density $n_e$ increases, the aspect ratio D/W having the lowest amount of transmission increases. Accordingly, during simulations, an upper limit of the aspect ratio D/W can be obtained by setting the highest electron density $n_e$ of the conductor surface wave TM.

When the width W of the groove is 6 mm, the aspect ratio D/W having the lowest amount of transmission is the highest. It can be found that the aspect ratio D/W at which 90% of the conductor surface wave TM is reflected by the groove 300a is 2.3. Accordingly, the inventers concluded that in order to suppress the propagation of the conductor surface wave TM, the aspect ratio D/W of the groove 300a needs to be determined to satisfy $0.26 \leq D/W \leq 2.3$.

⌈Width of the Groove⌋

Figure 11A:
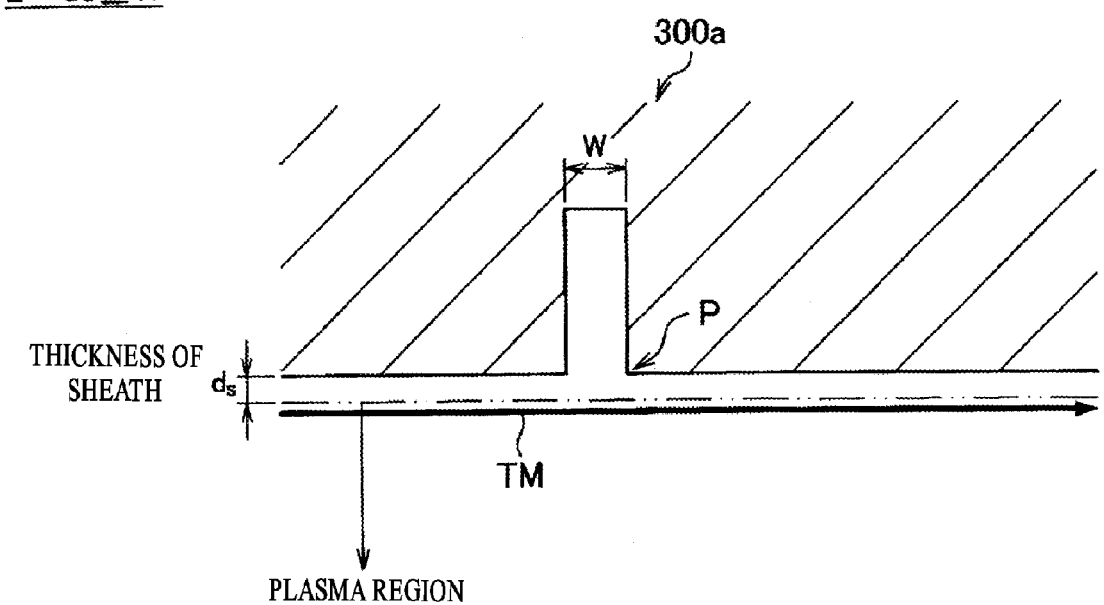
FIG. 11A is a cross-sectional view for explaining a relationship between the thickness of a sheath and the width of a groove.

Paying attention to a relationship between the width W of the groove 300a and the thickness $d_s$ of the sheath and between the width W of the groove 300a and the penetration length δ, the inventors tried to obtain the optimal width W of the groove 300a as follows. As shown in FIG. 11A, if the width W of the groove 300a is less than or equal to twice the thickness $d_s$ of the sheath ($2d_s \geq W$), the entire inner space of the groove 300a becomes a sheath region. As a result, since the thickness $d_s$ of the sheath does not have a step difference between a portion where the groove 300a is formed and a portion where the groove 300a is not formed, even though the groove 300a is formed, the conductor surface wave TM is not affected by the groove 300a. Accordingly, when $2d_s \geq W$, the groove 300a does not suppress the propagation.

Figure 11B:
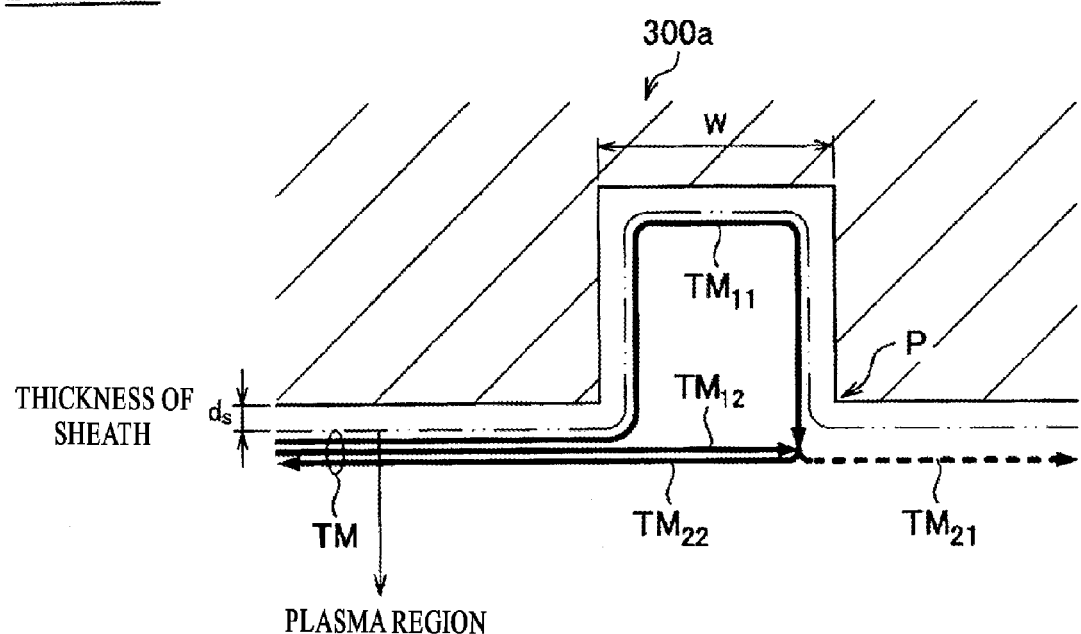
FIG. 11B is a cross-sectional view for explaining a relationship between the thickness of a sheath and the width of a groove.

As shown in FIG. 11B, if the width W of the groove 300a is greater than twice the thickness $d_s$ of the sheath ($2d_s < W$), since a sheath region formed along the bottom surface of the groove 300a has just a width of about 0.1 mm, the sheath region has a step difference when the groove 300a is formed. As a result, the conductor surface wave $TM_{11}$, which propagates along the bottom surface of the groove 300a, and the conductor surface wave $TM_{12}$, which jumps the groove 300a and propagates, are reflected at the end portion P, so that part of the conductor surface wave TM becomes the reflected wave, i.e., the conductor surface wave $TM_{22}$, and only the conductor surface wave $TM_{21}$ jumps the groove 300a and propagates. Accordingly, the inventors concluded that in order for the groove 300a to suppress the propagation of the conductor surface wave TM, the width W of the groove 300a needs to be greater than twice the thickness $d_s$ of the sheath ($2d_s < W$).

Alternatively, in order to optimize the width W of the groove 300a, the inventors paid attention to a relationship between the width W of the groove 300a and the penetration length δ. As described above, the penetration length δ indicates how deep a microwave can be introduced into the plasma P.

Figure 12A:
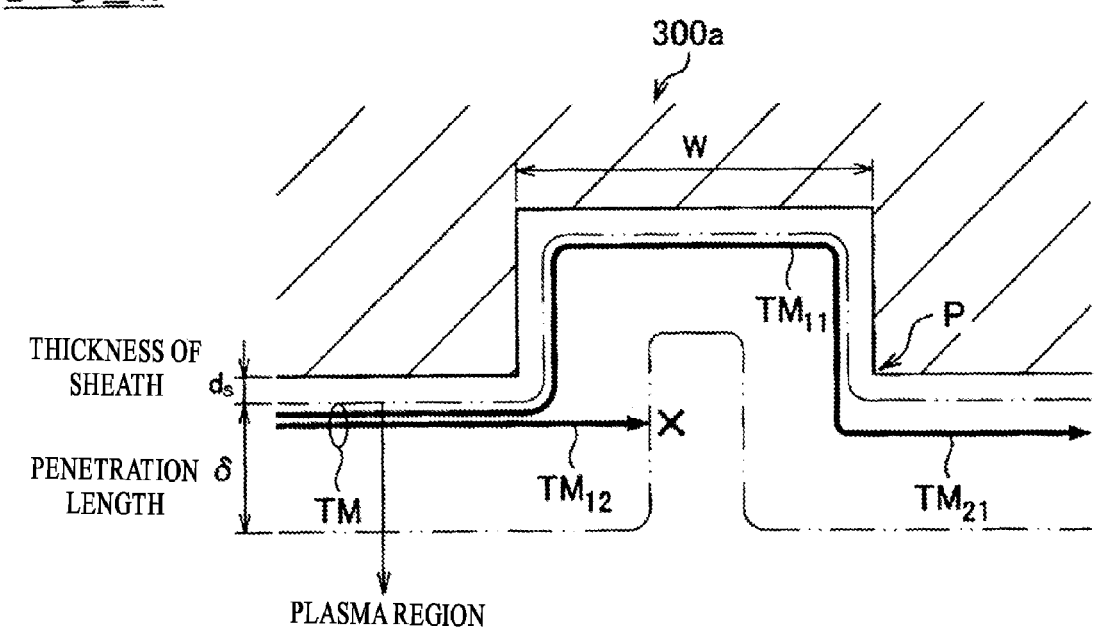
FIG. 12A is a cross-sectional view for explaining a relationship between a penetration length and the width of a groove.

The depth of the conductor surface wave TM introduced into the plasma from the boundary surface of the plasma P cannot be greater than the penetration length δ. Accordingly, if the width W of the groove 300a is greater than twice the penetration length δ ($2\delta \leq W$), as shown in FIG. 12A, the transmitted wave $TM_{12}$ cannot penetrate into the plasma more than the penetration length δ, and cannot jump the groove 300a and propagate. Consequently, even though the groove 300 having the width W that is equal to or greater than twice the penetration length δ is formed, reflection useful to suppress the propagation of the conductor surface wave TM does not occur at the end portion P of the groove 300a, and the conductor surface wave TM jumps the groove 300a and propagates forward.

Figure 12B:
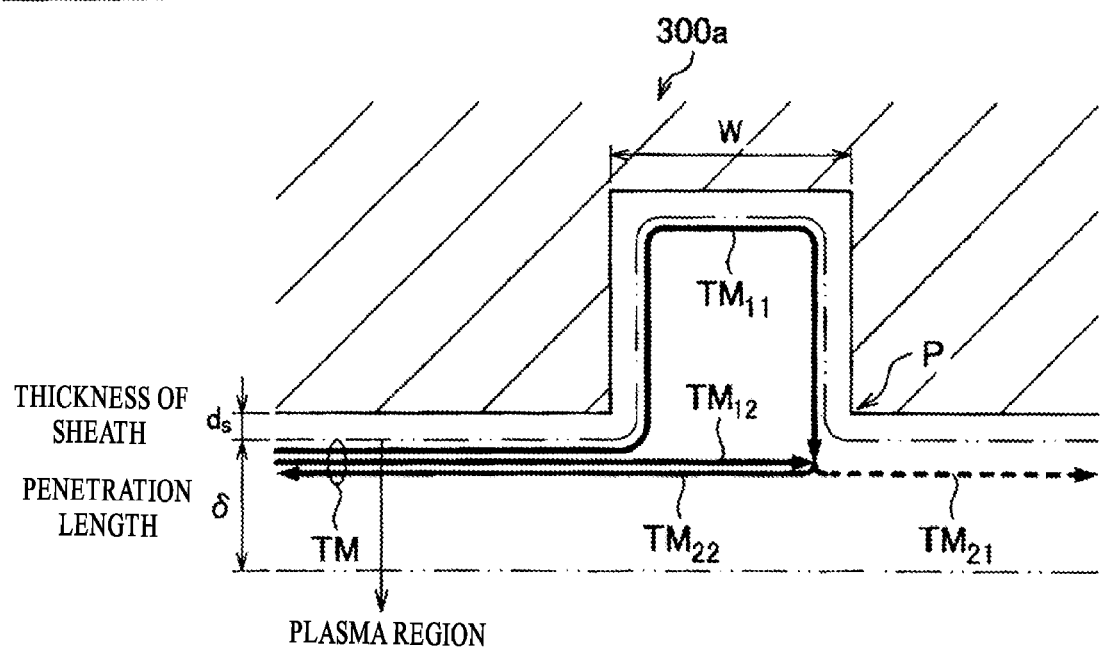
FIG. 12B is a cross-sectional view for explaining a relationship between a penetration length and the width of a groove.

As shown in FIG. 12B, if the width W of the groove 300a is less than twice the penetration length δ ($2\delta > W$), an area where the transmitted wave $TM_{12}$ cannot propagate is not formed. As a result, the conductor surface wave $TM_{11}$, which propagates along the bottom surface of the groove 300a, and the conductor surface wave $TM_{12}$, which jumps the groove 300a and propagates, are reflected at the end portion P of the groove 300a, so that part of the conductor surface wave TM becomes the reflected wave, i.e., the conductor surface wave $TM_{22}$, and only the conductor surface wave $TM_{21}$ jumps the groove 300a and propagates. Accordingly, the inventors concluded that in order for the groove 300a to suppress the propagation of the conductor surface wave TM, the width of the groove 300a needs to be less than twice the penetration length δ (2δ>W).

FIG. 10 will now be referred to again. In FIG. 10, the electron density $n_e$ is $1 \times 10^{12}$ cm$^{-3}$ and the penetration length δ is 5.3 mm. If the width W of the groove 300a is 4 mm and 6 mm, since the width W of the groove 300a is less than twice the penetration length δ, the amount of transmission can be reduced to be less than −40 dB by optimizing the aspect ratio D/W. If the width W of the groove 300a is 12 mm, since the width W of the groove 300a is greater than twice the penetration length δ, the amount of transmission cannot be reduced to be less than −10 dB even after optimizing the aspect ratio D/W.

⌈Radius of Curvature⌋

Since impedance is discontinuous at a corner Ca or Cb (see FIG. 8) or an edge of the groove 300a, part of a propagating conductor surface wave is reflected. If the corner or the edge is round, since the discontinuity of the impedance is reduced, the amount of transmission increases. In particular, if the radius of curvature R of the corner or the edge is too high to be neglected with respect to the wavelength of the conductor surface wave, the amount of transmission increases greatly.

Figure 13:
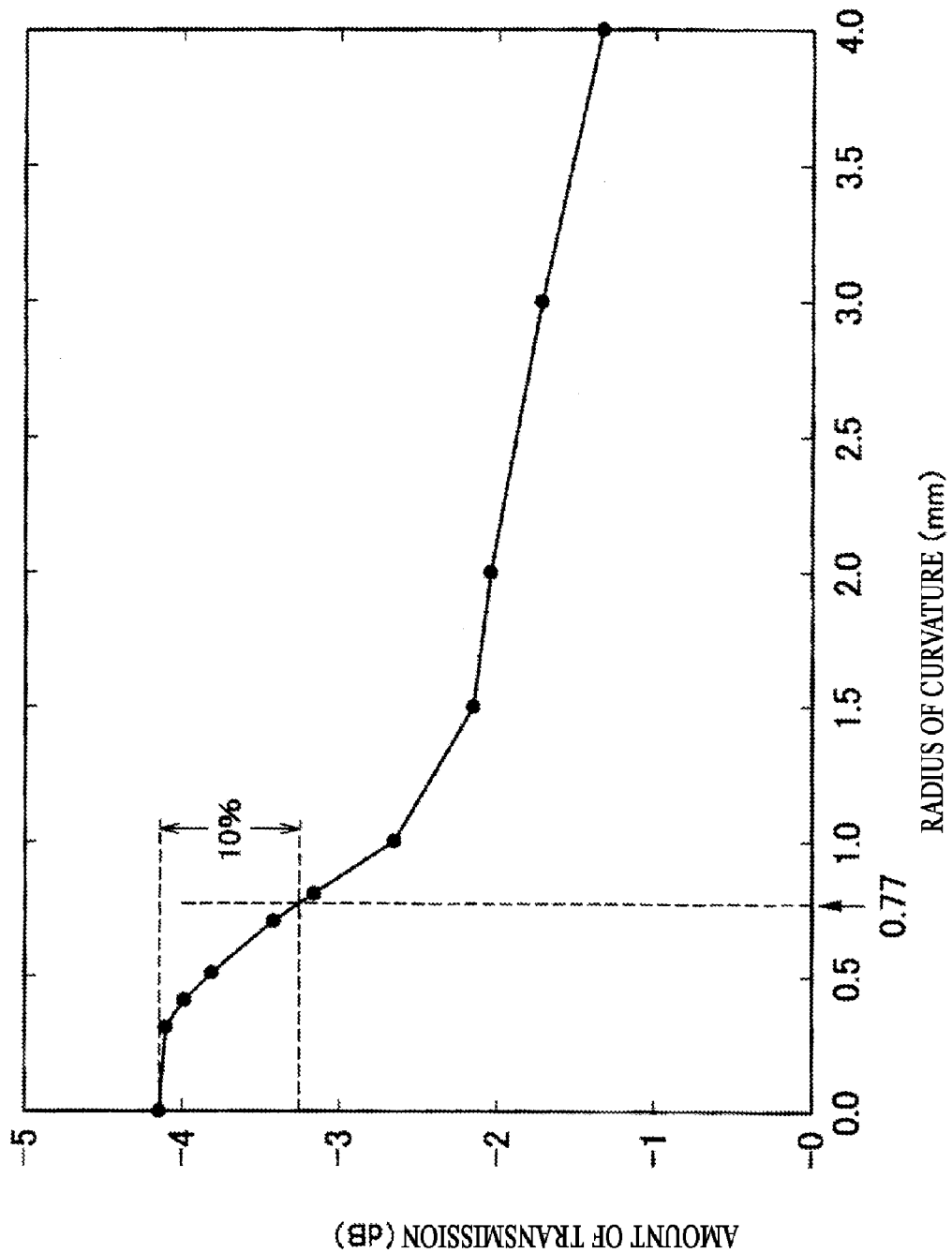
FIG. 13 is a graph illustrating a relationship between the amount of transmission and a radius of curvature.

Results obtained by calculating the amount of the conductor surface wave transmitted through one corner having the radius of curvature R using simulations are shown in FIG. 13. The electron density $n_e$ was set to $1 \times 10^{12}$ cm$^{-3}$ and a plasma potential was set to 24 V. In FIG. 13, the thickness $d_s$ of the sheath is 0.07 mm, the wavelength λ of the conductor surface wave is 30.4 mm, and the penetration length δ is 5.3 mm.

It is found that the amount of transmission of the conductor surface wave is the lowest when the radius of curvature R is 0 mm, that is, when the corner is right-angled, and the amount of transmission increases as the radius of curvature R increases. Assuming that the groove 300a has a function of suppressing the propagation until the amount of transmission is increased by 10% compared to when the radius of curvature R is 0, the radius of curvature R of the corner needs to be increased to 0.77 mm. 0.77 mm is about 1/40 (=0.77/30.4) of the wavelength λ (30.4 mm) of the conductor surface wave TM. From the simulation results and investigation, the inventors concluded that the radius of curvature R of the corner of the groove 300a needs to be less than 1/40 of the wavelength λ of the conductor surface wave TM.

⌈Location of the Groove⌋

As described above, the plasma P can be generated by forming the groove 300a to allow the conductor surface wave TM to propagate along the entire surface of the surface wave propagation portion 51. That is, since the plasma P can be generated over an entire bottom surface of the surface wave propagation portion 51 surrounded by the groove 300a, the area of the plasma P generated in the processing container 100 can be controlled according to the position of the groove 300a.

Typically, in the processing container 100 of the plasma processing apparatus 10, the plasma P is generated over and beyond the substrate G in order to perform uniform plasma processing on an entire top surface of the substrate G. Accordingly, the groove 300a may be formed in a part of the bottom surface of the lid 300 which exists beyond the substrate G, and the conductor surface wave may propagate over and beyond the substrate G.

Instead of or in addition to the groove 300a, the convex portion 300b (see FIG. 14) may be formed. It is difficult to change the shape of the groove 300a later whereas it is relatively easy to change the shape of the convex portion 300b by replacing it.

Figure 14:
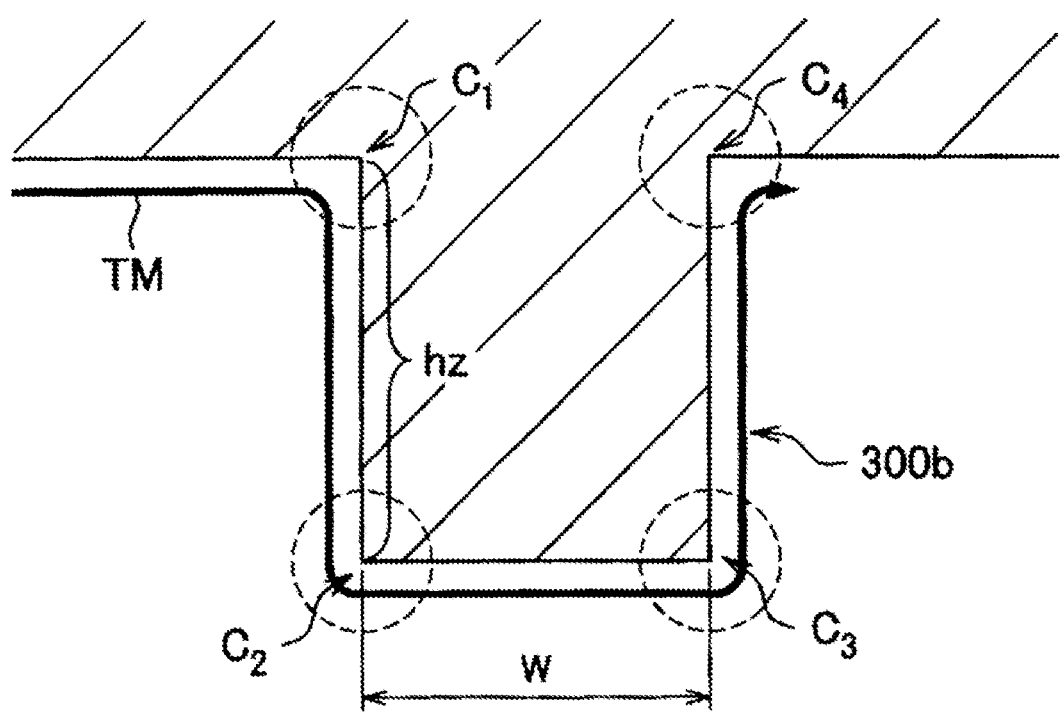
FIG. 14 is a cross-sectional view for explaining a conductor surface wave propagating along a convex portion.

The propagation of the conductor surface wave TM along the surface of the convex portion 300b will now be explained with reference to FIG. 14. The four angular points $C_1$ through $C_4$ may be considered as discontinuous points of impedance, three planes between the angular points $C_1$ through $C_4$ may be considered as transmission lines having certain characteristic impedance, and thus the convex portion 300b may be considered as a transmission line filter formed by connecting the four discontinuous points of impedance along the three transmission lines. Although the angular points $C_1$ through $C_4$ cannot sufficiently reflect the conductor surface wave TM, a small amount of transmission can be achieved by optimizing the lengths of the planes, that is, the lengths of the transmission lines, of the convex portion 300b.

The height $h_z$ of the convex portion 300b may be as low as possible. If the height $h_z$ of the convex portion 300b is too high, electrons and ions of the plasma P may be recombined at the wall surface of the convex portion 300b to disadvantageously reduce plasma density. Since the phase of the reflection coefficient of each transmission line is rotated 360° at half the wavelength of the electromagnetic wave, when the height $h_z$ of the convex portion 300b is equal to or less than half the wavelength of the conductor surface wave TM, all impedance can be realized.

Like the groove 300a, the height $h_z$ of the convex portion 300b needs to be greater than the thickness $d_s$ of the sheath, because if the height of the convex portion 300b is too low to be recognized as a step difference, the convex portion 300b cannot suppress the propagation of the conductor surface wave TM.

Figure 15A:
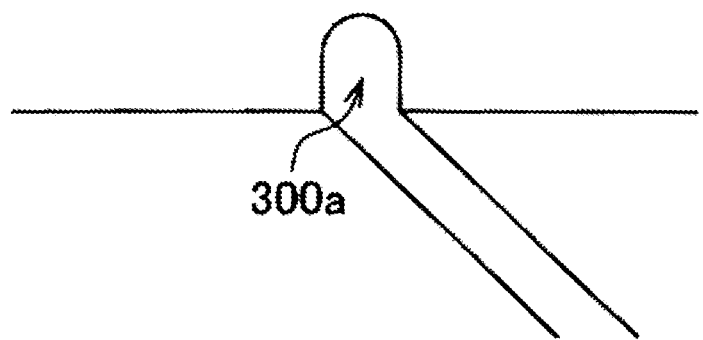
FIG. 15A illustrates a propagation disturbing portion according to an embodiment of the present invention.
Figure 15B:
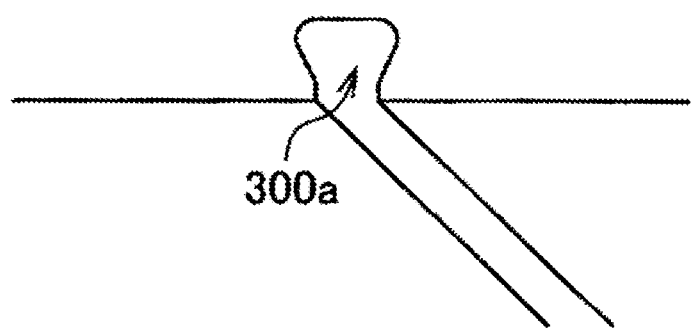
FIG. 15B illustrates a propagation disturbing portion according to another embodiment of the present invention.
Figure 15C:
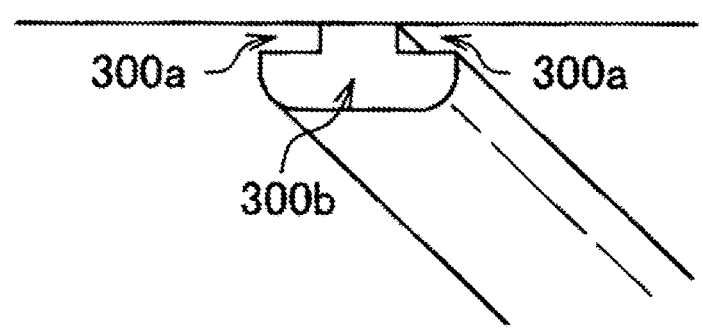
FIG. 15C illustrates a propagation disturbing portion according to another embodiment of the present invention.
Figure 15D:
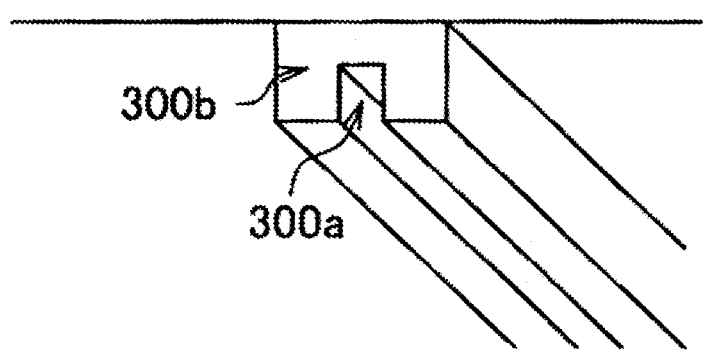
FIG. 15D illustrates a propagation disturbing portion according to another embodiment of the present invention.
Figure 15E:
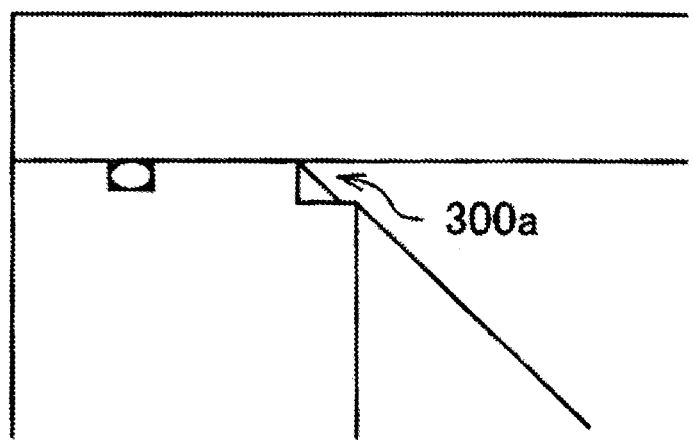
FIG. 15E illustrates a propagation disturbing portion according to another embodiment of the present invention.

Accordingly, the inventors concluded that in order to suppress the propagation of the conductor surface wave TM, the height H of the convex portion 300b needs to be greater than the thickness $d_s$ of the sheath and less than half the wavelength λ of the conductor surface wave TM The groove 300a or the convex portion 300b is an example of the propagation disturbing portion formed on the inner surface of the processing container 100 in order to suppress the propagation of the conductor surface wave. Other examples of the propagation disturbing portion may include a semicircular rectangular groove of FIG. 15A, a dovetail-shaped groove of FIG. 15B, a notch, which is a combination of the groove 300a and the convex portion 300b, of FIG. 15C, a C-shape, which is a combination of the groove 300a and the convex portion 300b, of FIG. 15D, and a groove 300a using a flange of FIG. 15E.

Figure 15F:
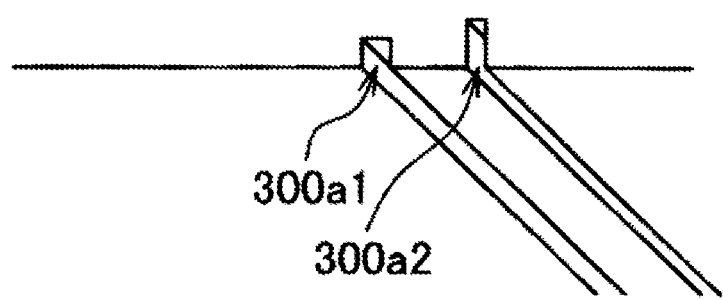
FIG. 15F illustrates a propagation disturbing portion according to another embodiment of the present invention.
Figure 16:
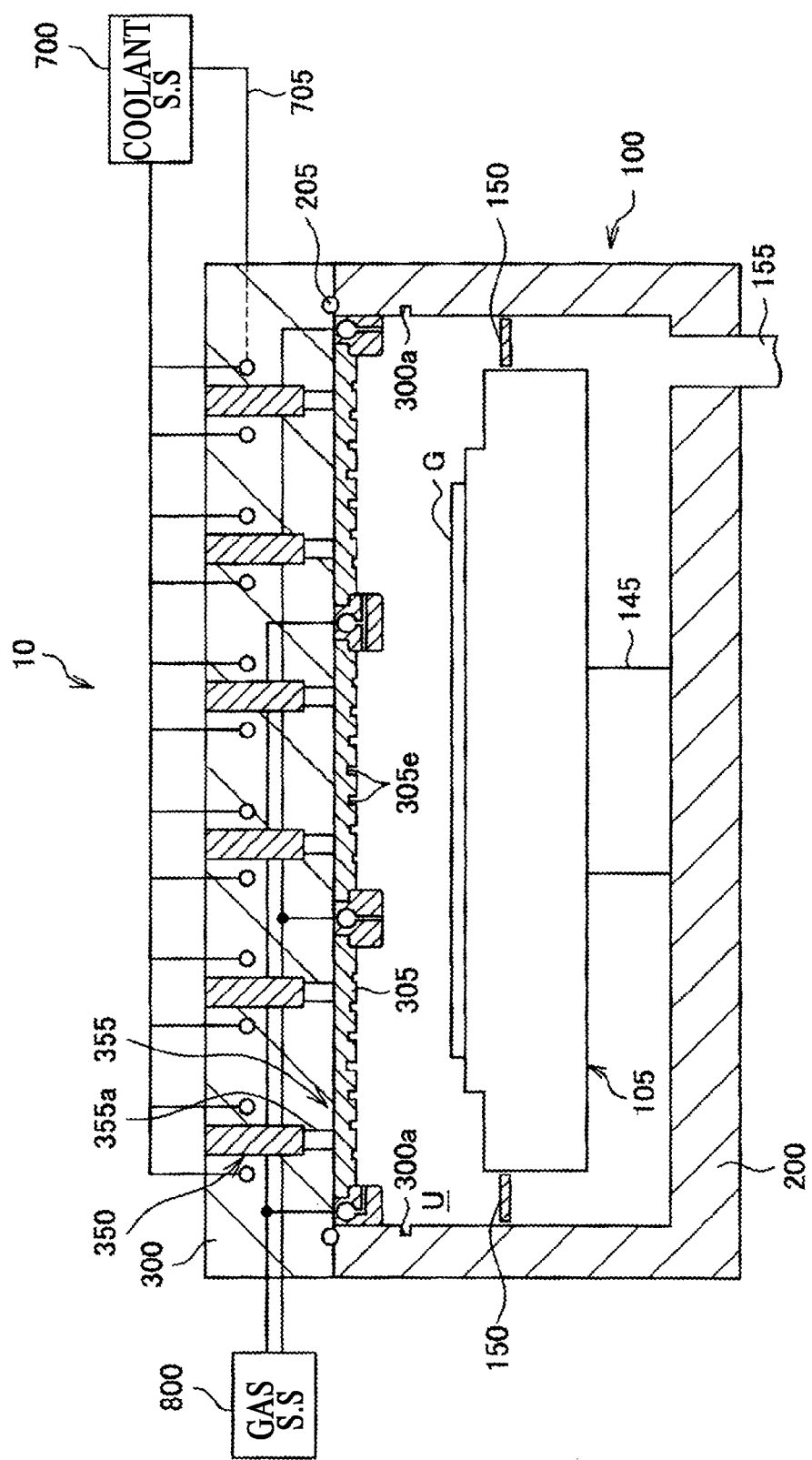
FIG. 16 is a cross-sectional view of a plasma processing apparatus according to another embodiment of the present invention.

A plurality of groove portions or convex portions may be formed substantially in parallel. The smaller the cross-sections of the groove portions or the convex portions, the farther away the groove portions or the convex portions may be formed from the metal electrodes As shown in FIG. 10, the optimal size of a groove or an optimal aspect ratio varies according to electron density. Accordingly, for example, as shown in FIG. 15F, if a plurality of grooves having different sizes or aspect ratios are arranged, for example, if a groove 300a1 having a size of 3 mm wide×3 mm deep and a groove 300a2 having a size of 2 mm wide×5 mm deep are formed in parallel, a wider electron density range can be used.

Figure 18:
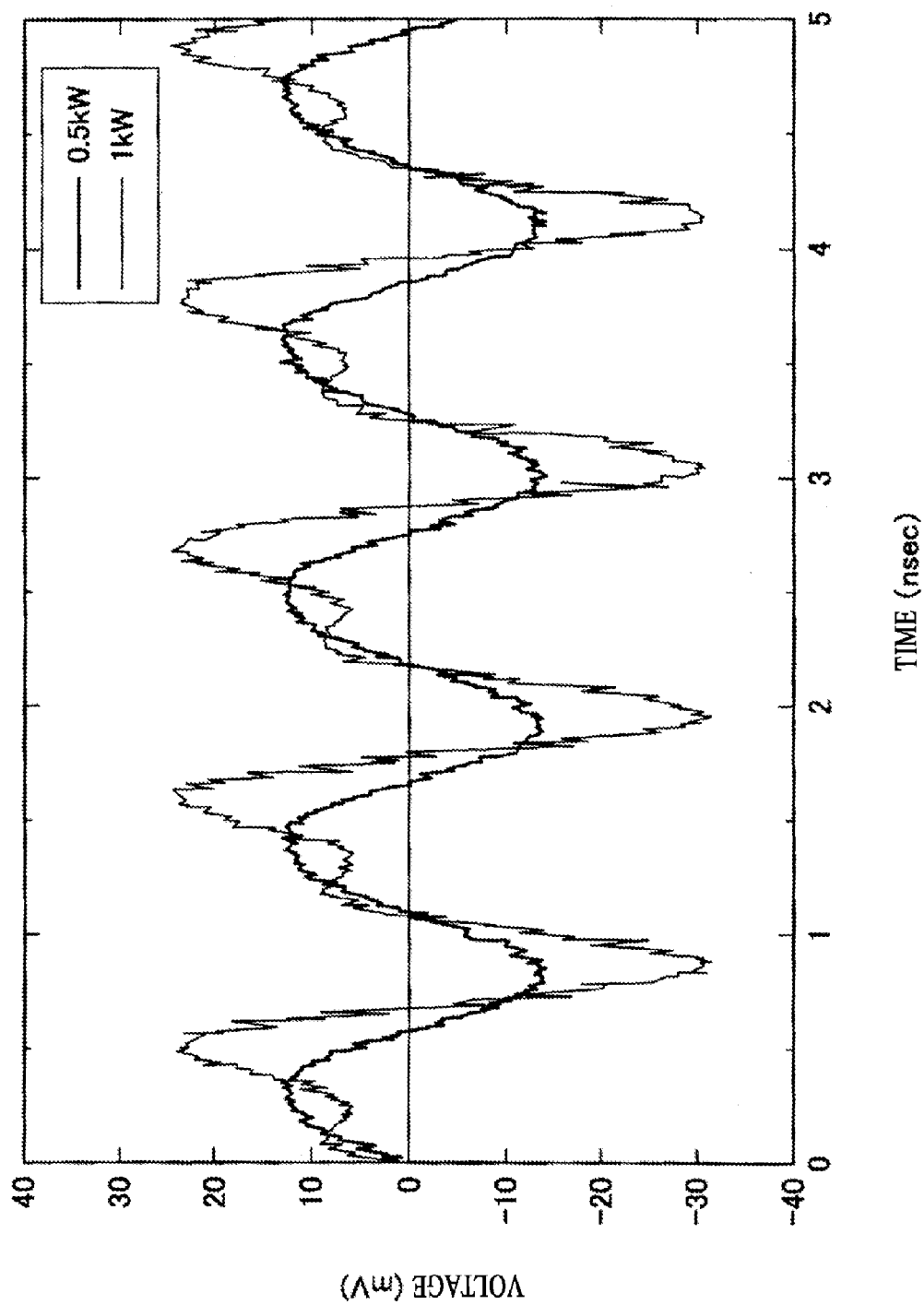
FIG. 18 is a graph illustrating the waveform of a conductor surface wave.

FIG. 18 illustrates the voltage waveform of a conductor surface wave TM when Ar is introduced to excite plasma using the conductor surface wave TM. Referring to FIG. 18, irrespective of whether low density (when the power of an introduced microwave is 0.5 kW) or high density (when the power of an introduced microwave is 1 kW), a fundamental wave component and a harmonic wave component are contained in the waveform of the conductor surface wave. The reason why the harmonic wave component is included in the waveform of the conductor surface wave is that since a relationship between a current and a voltage applied to a sheath is nonlinear, the waveform is distorted.

Accordingly, in order to reflect the conductor surface wave more effectively, as described above, the groove 300a2 for the harmonic wave as well as the groove 300a1 for the fundamental wave may be formed. Two or more groove portions or convex portions may be formed for the fundamental wave and the harmonic wave that is higher than a second-order wave. As shown in FIG. 15G, the width and depth of the groove 300a2 for the harmonic wave may be 1/I (I is a harmonic order) of the width and depth of the groove 300a1 for the fundamental wave.

As described above, when plasma processing using a low frequency microwave is performed in the plasma processing apparatus 10, the propagation of the conductor surface wave to a position where energy supply is unnecessary can be suppressed.

In the above embodiments, the operations of the elements are related with one another, and may be replaced with a series of other operations in consideration of the relations. Accordingly, the embodiments of the plasma processing apparatus may be applied to embodiments of a method of using a plasma processing apparatus and a method of cleaning a plasma processing apparatus.

The preface in "Microwave Plasma Technology", by The Institute of Electrical Engineers of Japan & the Investigation Committee on Microwave Plasma, Ohmsha, Ltd. (Sep. 25, 2003) describes that "the microwave band" refers to a frequency region of 300 MHz or more in the UHF band. In the present specification, therefore, the frequency of the microwave is referred to as being 300 MHz or more.

Although in the above embodiments, the microwave source 900 outputs a microwave having a frequency of 915 MHz, other microwave sources outputting a microwave having a frequency of 896 MHz, 922 MHz, and 2.45 GHz may also be used. The microwave source is an example of an electromagnetic wave source that generates an electromagnetic wave (energy) for exciting plasma. If the microwave source is an electromagnetic wave having a frequency of 100 MHz or more, examples of the electromagnetic wave source may include a magnetron source and a high frequency power source.

The embodiments of the present invention have been explained with reference to the accompanying drawings, but it will be appreciated that the present invention is not limited to the disclosed embodiments. It should be understood by one of ordinary skill in the art that various changes or modifications may occur insofar as they are within the scope of the appended claims or the equivalents thereof.

For example, the plasma processing apparatus according to the present invention is not limited to having an axial structure as described above. Accordingly, the plasma processing apparatus 10 may supply a microwave into the processing container 100 from the dielectric plates 305 by forming slots 355a in a slot antenna 355 under the waveguide 350 and transmitting the microwave through the slots 355a. Processing uniformity can be prevented from decreasing since the groove 300a surrounding all of the dielectric plates 305 or the entire ceiling surface are formed in the inner surface of the processing container 100 of the plasma processing apparatus 10 to suppress the propagation of the conductor surface wave.

The concave portions 305e formed in the surface of the dielectric plates 305 facing the substrate G do not have the same width but increase in depth the farther away they are from the slots 355a. Uniform plasma can be generated since the thicknesses of the dielectric plates 305 increase the closer they are to a power supply point and thus microwave energy is uniformly supplied at the bottoms of the dielectric plates 305. The thicknesses of the dielectric plates 305 at the positions of the concave portions 305e are set so as not to substantially disturb the propagation of the microwave when the microwave propagates through the dielectric plates 305.

Figure 17:
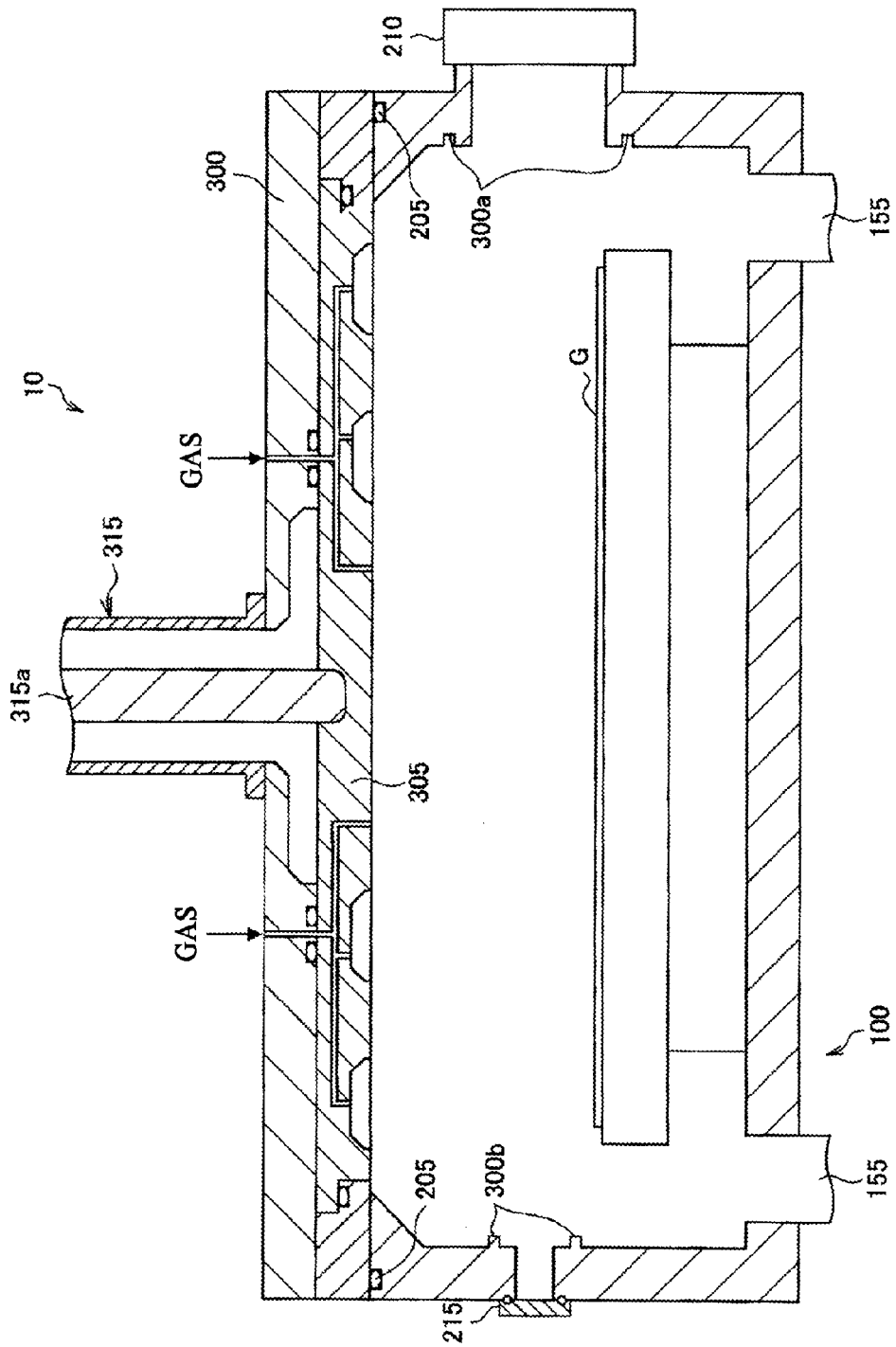
FIG. 17 is a cross-sectional view of a plasma processing apparatus according to another embodiment of the present invention.

The groove 300a may be formed in any place as long as the groove 300a is formed in the inner surface of the processing container 100 contacting plasma during plasma processing. For example, as shown in FIG. 17, the groove 300a may surround the opening of the gate valve 210, the view port 215, the gas exhaust pipe 155, or the like. Accordingly, for example, equipment can be prevented from being damaged, and reaction products can be prevented from being adhered to the equipment.

The inner conductors 315a are examples of a plurality of conductor rods that are adjacent to the plurality of dielectric plates 305 and propagate the microwave to the plurality of dielectric plates 305. The conductor rods may be connected to the dielectric plates 305 electromagnetically and mechanically. The conductor rods, as shown in FIG. 17, may be adjacent to the plurality of dielectric plates 305 and thus although not shown, may be electromagnetically connected to the plurality of dielectric plates 305 and not be mechanically connected to the plurality of dielectric plates 305. The conductor rods may have a plate shape or a tapered shape.

In particular, an uncontrolled gap generated due to a mechanical difference or thermal expansion may make the electrical characteristics of the plasma processing apparatus 10 unstable. However, if the conductor rods are adjacent to the dielectric plates 305 and thus a controlled gap is formed between the conductor rods and the dielectric plates 305, a microwave can efficiently propagate to the dielectric plates 305 without making the electrical characteristics of the plasma processing apparatus 10 unstable.

The plasma processing apparatus according to the present invention can process various substrates such as large-area glass substrates, circular silicon wafers, and square silicon-on-insulator (SOI) substrates.

Moreover, the plasma processing apparatus according to the present invention can perform various plasma processing such as film formation, diffusion, etching, and ashing.

The invention claimed is:

1. A plasma processing apparatus for plasma-processing an object by exciting a gas using an electromagnetic wave, the plasma processing apparatus comprising:
   a processing container sealed with a lid and comprising a metal;
   an electromagnetic wave source for outputting an electromagnetic wave to the processing container through a wave guide, wherein the electromagnetic wave output by the electromagnetic wave source has a frequency of equal to or less than 1.9 GHz;
   a holding stage which holds the object;
   a dielectric plate disposed on a bottom surface of the lid and facing the holding stage of the processing container and transmitting the electromagnetic wave, which is output from the electromagnetic wave source, into the processing container;
   a surface wave propagation region adjacent to and surrounding the dielectric plate and consisting of a metal surface of the bottom surface of the lid of the processing container which faces the holding stage and is exposed to plasma, the electromagnetic wave propagating along the surface wave propagation region; and a groove portion or a convex portion formed on the metal surface of the bottom surface of the lid of the processing container which faces the holding stage and is exposed to plasma, and surrounding the dielectric plate and the surface wave propagation region, wherein the groove portion or the convex portion suppresses propagation of the electromagnetic wave; and the convex portion consists of a metal.

2. The plasma processing apparatus of claim 1, wherein the groove portion is sized for preventing the electromagnetic wave from propagating further along the metal surface of the bottom surface of the lid of the processing container.

3. The plasma processing apparatus of claim 1, wherein the groove portion has a substantially rectangular cross-section, and has a width W and a depth D satisfying $0.26<D/W<2.3$.

4. The plasma processing apparatus of claim 3, wherein the width of the groove portion is less than twice a penetration length of the electromagnetic wave into plasma and greater than twice a thickness of a sheath formed between the plasma and the metal surface of the bottom surface of the lid of the processing container.

5. The plasma processing apparatus of claim 1, wherein the groove portion has a corner having a radius of curvature that is less than 1/40 of the wavelength $\lambda$ of the electromagnetic wave propagating between plasma and the metal surface of the bottom surface of the lid of the processing container.

6. The plasma processing apparatus of claim 1, wherein the groove portion has a cross-section selected from at least the group consisting of a substantially rectangular cross-section, a substantially semicircular cross-section, and a substantially tapered cross-section.

7. The plasma processing apparatus of claim 1, wherein the convex portion has a substantially rectangular cross-section, and has a height that is less than half the wavelength of the electromagnetic wave propagating along the metal surface of the bottom surface of the lid of the processing container and greater than a thickness of a sheath formed between plasma and the metal surface of the bottom surface of the lid of the processing container.

8. The plasma processing apparatus of claim 1, wherein the convex portion has a cross-section selected from the group consisting of a substantially rectangular cross-section, a C-shaped cross-section, and a T-shaped cross-section.

9. The plasma processing apparatus of claim 1, wherein a plurality of dielectric plates are used, and the groove portion or the convex portion is formed on the metal surface of the bottom surface of the lid of the processing container to separately surround each of the plurality of dielectric plates.

10. The plasma processing apparatus of claim 9, wherein a plurality of dielectric plates are used, and the groove portion or the convex portion is formed on the metal surface of the bottom surface of the lid of the processing container to surround all of the plurality of dielectric plates disposed together.

11. The plasma processing apparatus of claim 10, wherein the plurality of dielectric plates are arranged at regular intervals.

12. The plasma processing apparatus of claim 9, wherein the groove portion or the convex portion is formed at the same distance from outer circumferential surfaces of dielectric plates adjacent to each other.

13. The plasma processing apparatus of claim 1, wherein a plurality of dielectric plates are arranged continuously or discontinuously to form a cylindrical or polygonal shape, and the groove portion or the convex portion is formed on the metal surface of the bottom surface of the lid of the processing container to surround the center of inside of the cylindrical or polygonal shape.

14. The plasma processing apparatus of claim 1, wherein a plurality of groove portions or convex portions are formed substantially in parallel.

15. The plasma processing apparatus of claim 14, wherein one or more metal electrodes are formed on a bottom surface of the dielectric plate, and the smaller the cross-sections of each of the plurality of groove portions or convex portions, the farther away each of the plurality of groove portions or convex portions are from the one or more metal electrodes.

16. The plasma processing apparatus of claim 1, wherein an area of a region surrounded by the groove portion or the convex portion is larger than an area of the object.

* * * * *